(12) United States Patent
Sampica et al.

(10) Patent No.: US 8,363,189 B2
(45) Date of Patent: Jan. 29, 2013

(54) ALKALI SILICATE GLASS FOR DISPLAYS

(75) Inventors: James D. Sampica, Springville, IA (US); Tracy J. Barnidge, Marion, IA (US); Joseph L. Tchon, Cedar Rapids, IA (US); Nathan P. Lower, North Liberty, IA (US); Ross K. Wilcoxon, Cedar Rapids, IA (US); Sandra S. Dudley, Walker, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 753 days.

(21) Appl. No.: 12/493,022

(22) Filed: Jun. 26, 2009

(65) Prior Publication Data

US 2009/0262290 A1 Oct. 22, 2009

Related U.S. Application Data

(63) Continuation-in-part of application No. 11/959,225, filed on Dec. 18, 2007, and a continuation-in-part of application No. 12/240,775, filed on Sep. 29, 2008.

(51) Int. Cl.
*G02F 1/1333* (2006.01)
(52) U.S. Cl. ........................................ 349/122; 349/138
(58) Field of Classification Search .......... 438/151–166, 438/30; 257/59–62; 349/122, 138
See application file for complete search history.

(56) References Cited

U.S. PATENT DOCUMENTS

| | | | |
|---|---|---|---|
| 3,508,974 A | 4/1970 | Bressler |
| 3,654,528 A | 4/1972 | Barkan |
| 3,723,790 A | 3/1973 | Dumbaugh et al. |
| 3,812,404 A | 5/1974 | Barkan et al. |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,513,029 A | 4/1985 | Sakai |
| 4,560,084 A | 12/1985 | Wolfson |
| 4,572,924 A | 2/1986 | Wakely et al. |
| 4,622,433 A | 11/1986 | Frampton |
| 4,761,518 A | 8/1988 | Butt et al. |
| 4,765,948 A | 8/1988 | Deluca et al. |
| 4,773,826 A | 9/1988 | Mole |
| 4,802,531 A | 2/1989 | Nathenson et al. |
| 4,882,212 A | 11/1989 | Singhdeo et al. |
| 5,041,342 A | 8/1991 | Umeda et al. |
| 5,136,365 A | 8/1992 | Pennisi et al. |
| 5,140,109 A | 8/1992 | Matsumoto et al. |
| 5,184,211 A | 2/1993 | Fox |
| 5,195,231 A | 3/1993 | Fanning et al. |
| 5,232,970 A | 8/1993 | Solc et al. |

(Continued)

FOREIGN PATENT DOCUMENTS

| JP | 60-013875-0 | 1/1900 |
|---|---|---|
| JP | 60-013875 | 1/1985 |

(Continued)

OTHER PUBLICATIONS

International Search Report and Written Opinion for International Application No. PCT/US2008/074224, mail date Jan. 30, 2009, 9 pages.

(Continued)

*Primary Examiner* — Richard A. Booth
(74) *Attorney, Agent, or Firm* — Donna P. Suchy; Daniel M. Barbieri

(57) ABSTRACT

A display assembly comprises an electronic display element, a layer of material, and an alkali silicate glass material at least partially covering at least one of the electronic display element and the layer of material.

20 Claims, 16 Drawing Sheets

U.S. PATENT DOCUMENTS

| | | | |
|---|---|---|---|
| 5,244,726 | A | 9/1993 | Laney et al. |
| 5,265,136 | A | 11/1993 | Yamazaki et al. |
| 5,315,155 | A | 5/1994 | O'Donnelly et al. |
| 5,502,889 | A | 4/1996 | Casson et al. |
| 5,581,286 | A | 12/1996 | Hayes et al. |
| 5,686,703 | A | 11/1997 | Yamaguchi |
| 5,702,963 | A | 12/1997 | Vu et al. |
| 5,863,605 | A | 1/1999 | Bak-Boychuk et al. |
| 5,916,944 | A | 6/1999 | Camilletti et al. |
| 5,958,794 | A | 9/1999 | Bruxvoort et al. |
| 5,965,947 | A | 10/1999 | Nam et al. |
| 5,991,351 | A | 11/1999 | Woolley |
| 6,010,956 | A | 1/2000 | Takiguchi et al. |
| 6,019,165 | A | 2/2000 | Batchelder |
| 6,021,844 | A | 2/2000 | Batchelder |
| 6,027,791 | A | 2/2000 | Higashi et al. |
| 6,028,619 | A | 2/2000 | Saita et al. |
| 6,039,896 | A | 3/2000 | Miyamoto et al. |
| 6,048,656 | A | 4/2000 | Akram et al. |
| 6,087,018 | A | 7/2000 | Uchiyama |
| 6,110,656 | A | 8/2000 | Eichorst et al. |
| 6,121,175 | A | 9/2000 | Drescher et al. |
| 6,124,224 | A | 9/2000 | Sridharan et al. |
| 6,159,910 | A | 12/2000 | Shimizu et al. |
| 6,356,334 | B1 | 3/2002 | Mathew et al. |
| 6,423,415 | B1 | 7/2002 | Greene et al. |
| 6,452,090 | B2 | 9/2002 | Takato et al. |
| 6,486,087 | B1 | 11/2002 | Saling et al. |
| 6,586,087 | B2 | 7/2003 | Young |
| 6,599,643 | B2 | 7/2003 | Heimann et al. |
| 6,658,861 | B1 | 12/2003 | Ghoshal et al. |
| 6,665,186 | B1 | 12/2003 | Calmidi et al. |
| 6,708,501 | B1 | 3/2004 | Ghoshal et al. |
| 6,798,072 | B2 | 9/2004 | Kajiwara et al. |
| 6,800,326 | B1 | 10/2004 | Uchiyama |
| 6,918,984 | B2 | 7/2005 | Murray et al. |
| 7,045,905 | B2 | 5/2006 | Nakashima |
| 7,078,263 | B2 | 7/2006 | Dean |
| 7,131,286 | B2 | 11/2006 | Ghoshal et al. |
| 7,176,564 | B2 | 2/2007 | Kim |
| 7,202,598 | B2 | 4/2007 | Juestel et al. |
| 7,293,416 | B2 | 11/2007 | Ghoshal |
| 7,296,417 | B2 | 11/2007 | Ghoshal |
| 7,297,206 | B2 | 11/2007 | Naruse et al. |
| 7,340,904 | B2 | 3/2008 | Sauciuc et al. |
| 7,342,787 | B1 | 3/2008 | Bhatia |
| 7,348,665 | B2 | 3/2008 | Sauciuc et al. |
| 7,391,060 | B2 | 6/2008 | Oshio |
| 7,491,431 | B2 | 2/2009 | Chiruvolu et al. |
| 7,692,259 | B2 | 4/2010 | Suehiro |
| 7,737,356 | B2 | 6/2010 | Goldstein |
| 8,076,185 | B1 | 12/2011 | Lower et al. |
| 2001/0015443 | A1 | 8/2001 | Komoto |
| 2001/0046933 | A1 | 11/2001 | Parkhill et al. |
| 2002/0000630 | A1 | 1/2002 | Coyle |
| 2002/0054976 | A1 | 5/2002 | Nakamura et al. |
| 2002/0076192 | A1 | 6/2002 | Bartholomew et al. |
| 2002/0078856 | A1 | 6/2002 | Hahn et al. |
| 2002/0086115 | A1 | 7/2002 | Lamers et al. |
| 2002/0170173 | A1 | 11/2002 | Mashino |
| 2002/0189495 | A1 | 12/2002 | Hayashi et al. |
| 2002/0189894 | A1 | 12/2002 | Davis et al. |
| 2003/0047735 | A1 | 3/2003 | Kyoda et al. |
| 2003/0080341 | A1 | 5/2003 | Sakano et al. |
| 2003/0218258 | A1 | 11/2003 | Charles et al. |
| 2003/0228424 | A1 | 12/2003 | Dove et al. |
| 2004/0106037 | A1 | 6/2004 | Cho et al. |
| 2004/0116577 | A1 | 6/2004 | Naruse et al. |
| 2004/0156995 | A1 | 8/2004 | Komiyama et al. |
| 2004/0194667 | A1 | 10/2004 | Reuscher |
| 2005/0003947 | A1 | 1/2005 | Mazany et al. |
| 2005/0082691 | A1 | 4/2005 | Ito et al. |
| 2005/0099775 | A1 | 5/2005 | Pokharna et al. |
| 2005/0123684 | A1 | 6/2005 | Makowski et al. |
| 2005/0179742 | A1 | 8/2005 | Keenan et al. |
| 2006/0045755 | A1 | 3/2006 | McDonald et al. |
| 2006/0068218 | A1 | 3/2006 | Hooghan et al. |
| 2006/0095677 | A1 | 5/2006 | Hakura et al. |
| 2006/0113066 | A1 | 6/2006 | Mongia et al. |
| 2006/0135342 | A1 | 6/2006 | Anderson et al. |
| 2006/0158849 | A1 | 7/2006 | Martin et al. |
| 2006/0250731 | A1 | 11/2006 | Parkhurst et al. |
| 2006/0268525 | A1 | 11/2006 | Jeong |
| 2006/0283546 | A1 | 12/2006 | Tremel et al. |
| 2007/0075323 | A1 | 4/2007 | Kanazawa et al. |
| 2007/0102833 | A1 | 5/2007 | Hack et al. |
| 2007/0108586 | A1 | 5/2007 | Uematsu et al. |
| 2007/0224400 | A1 | 9/2007 | Meguro et al. |
| 2008/0006204 | A1 | 1/2008 | Rusinko et al. |
| 2008/0050512 | A1 | 2/2008 | Lower et al. |
| 2008/0063875 | A1 | 3/2008 | Robinson et al. |
| 2008/0142966 | A1 | 6/2008 | Hirano et al. |
| 2008/0299300 | A1 | 12/2008 | Wilcoxon et al. |
| 2009/0279257 | A1 | 11/2009 | Lower et al. |

FOREIGN PATENT DOCUMENTS

| | | |
|---|---|---|
| JP | 57-027942 | 2/1985 |
| JP | 02-064071 | 3/1990 |
| JP | 2003-332505 | 11/2003 |
| JP | 2006-045420 | 2/2006 |
| WO | WO 2006/095677 | 9/2006 |

OTHER PUBLICATIONS

Office Action for U.S. Appl. No. 12/284,670, mail date Sep. 28, 2010, 11 pages.
Office Action for U.S. Appl. No. 12/116,126, mail date Oct. 25, 2010, 9 pages.
Office Action for U.S. Appl. No. 12/286,207, mail date Dec. 27, 2010, 15 pages.
Office Action for U.S. Appl. No. 11/508,782, mail date Jan. 19, 2011, 10 pages.
Office Action for U.S. Appl. No. 11/732,982, mail date Feb. 2, 2011, 16 pages.
Office Action for U.S. Appl. No. 12/284,670, mail date Feb. 17, 2011, 13 pages.
Office Action for U.S. Appl. No. 12/116,126, mail date Feb. 25, 2011, 9 pages.
Office Action for U.S. Appl. No. 11/732,981, mail date Mar. 16, 2011, 7 pages.
Notice of Allowance for U.S. Appl. No. 12/284,670, mail date May 11, 2011, 7 pages.
Notice of Allowance for U.S. Appl. No. 11/784,932, mail date May 12, 2011, 11 pages.
Notice of Allowance for U.S. Appl. No. 11/508,782, mail date May 31, 2011, 9 pages.
Notice of Allowance for U.S. Appl. No. 12/286,207, mail date Jun. 27, 2011, 12 pages.
Office Action for U.S. Appl. No. 11/959,225, mail date Apr. 13, 2011, 17 pages.
Office Action for U.S. Appl. No. 12/116,126, mail date May 10, 2011, 8 pages.
Office Action for U.S. Appl. No. 12/240,775, mail date May 26, 2011, 10 pages.
Office Action for U.S. Appl. No. 11/732,982, mail date Jun. 21, 2011, 15 pages.
Office Action for U.S. Appl. No. 12/116,126, mail date Apr. 22, 2010, 7 pages.
Office Action for U.S. Appl. No. 11/959,225, mail date May 26, 2010, 17 pages.
Office Action for U.S. Appl. No. 11/784,158, mail date Jun. 17, 2010, 7 pages.
Amendment and Reply for U.S. Appl. No. 12/116,126, mail date Dec. 12, 2011, 10 pages.
Amendment and Reply for U.S. Appl. No. 11/732,982, mail date Jan. 13, 2012, 11 pages.
Notice of Allowance for U.S. Appl. No. 12/116,126, mail date Jan. 5, 2012, 10 pages.
Amendment and Reply for U.S. Appl. No. 12/240,775, mail date Sep. 26, 2011, 11 pages.
Restriction Requirement for U.S. Appl. No. 12/240,775, mail date Jan. 12, 2012, 5 pages.

Notice of Allowance for U.S. Appl. No. 11/508,782, mail date Jul. 26, 2011, 4 pages.
Request for Continued Examination for U.S. Appl. No. 11/732,981, mail date Oct. 25, 2011, 4 pages.
Notice of Allowance for U.S. Appl. No. 11/732,981, mail date Dec. 29, 2011, 7 pages.
International Search Report and Written Opinion for Application No. PCT/US2009/036355, mail date Jun. 30, 2009, 11 pages.
International Search Report and Written Opinion for Application No. PCT/US2009/031699, mail date Aug. 18, 2009, 16 pages.
Office Action for U.S. Appl. No. 12/116,126, mail date Nov. 20, 2009, 7 pages.
Office Action for U.S. Appl. No. 11/959,225, mail date Dec. 2, 2009, 15 pages.
Office Action for U.S. Appl. No. 11/784,932, mail date Feb. 16, 2010, 11 pages.
Office Action for U.S. Appl. No. 11/508,782, mail date Feb. 24, 2010, 12 pages.
Office Action for U.S. Appl. No. 11/784,158, mail date Mar. 26, 2010, 7 pages.
Office Action for U.S. Appl. No. 11/508,782, mail date Dec. 24, 2008, 9 pages.
Amendment and Reply for U.S. Appl. No. 11/508,782, mail date Sep. 2, 2008, 7 pages.
Amendment and Reply for U.S. Appl. No. 11/508,782, mail date Mar. 24, 2009, 10 pages.
Amendment and Reply for U.S. Appl. No. 11/508,782, mail date Aug. 14, 2009, 12 pages.
Advisory Action received for U.S. Appl. No. 11/508,782, mail date Aug. 31, 2009, 3 pages.
Response for U.S. Appl. No. 11/508,782, mail date Nov. 13, 2009, 14 pages.
Amendment and Reply for U.S. Appl. No. 11/508,782, mail date Jun. 24, 2010, 10 pages.
Amendment and Reply for U.S. Appl. No. 11/508,782, mail date Nov. 2, 2010, 12 pages.
Supplemental Amendment and Reply for U.S. Appl. No. 11/508,782, mail date Nov. 3, 2010, 3 pages.
Advisory Action for U.S. Appl. No. 11/508,782, mail date Nov. 23, 2010, 5 pages.
Request for Continued Examination with Amendment for U.S. Appl. No. 11/508,782, mail date Dec. 2, 2010, 13 pages.
Examiner Interview Summary for U.S. Appl. No. 11/508,782, mail date Jan. 5, 2011, 2 pages.
Amendment and Reply for U.S. Appl. No. 11/508,782, mail date Apr. 5, 2011, 8 pages.
Supplemental Notice of Allowance for U.S. Appl. No. 11/508,782, mail date Jul. 26, 2011, 4 pages.
Request for Continued Examination for U.S. Appl. No. 11/508,782, mail date Aug. 30, 2011, 4 pages.
Notice of Allowance for U.S. Appl. No. 11/508,782, mail date Sep. 20, 2011, 7 pages.
Response for U.S. Appl. No. 11/784,158, mail date Jan. 8, 2010, 10 pages.
Amendment and Reply for U.S. Appl. No. 11/784,158, mail date May 26, 2010, 12 pages.
Terminal Disclaimer for U.S. Appl. No. 11/784,158, mail date May 26, 2010, 1 page.
Office Action for U.S. Appl. No. 11/959,225, mail date Jul. 22, 2009, 10 pages.
Response to Office Action for U.S. Appl. No. 11/959,225, mail date Mar. 2, 2010, 9 pages.
Amendment and Reply for U.S. Appl. No. 11/959,225, mail date Jan. 27, 2011, 9 pages.
Amendment and Reply for U.S. Appl. No. 11/959,225, mail date Jun. 13, 2011, 12 pages.
Advisory Action for U.S. Appl. No. 11/959,225, mail date Jul. 5, 2011, 3 pages.
Office Action for U.S. Appl. No. 11/959,225, mail date Nov. 18, 2011, 17 pages.
Response for U.S. Appl. No. 12/116,126, mail date Feb. 22, 2010, 10 pages.
Amendment and Reply for U.S. Appl. No. 12/116,126, mail date Aug. 10, 2011, 11 pages.
Office Action for U.S. Appl. No. 12/116,126, mail date Sep. 12, 2011, 11 pages.
Request for Continued Examination with Amendment for U.S. Appl. No. 11/732,981, mail date May 16, 2011, 12 pages.
Notice of Allowance for U.S. Appl. No. 11/732,981, mail date Jul. 26, 2011, 7 pages.
Response to Office Action for U.S. Appl. No. 11/784,932, mail date Jul. 2, 2009, 8 pages.
Request for Continued Examination for U.S. Appl. No. 11/784,932, Aug. 10, 2011, 4 pages.
Notice of Allowance for U.S. Appl. No. 11/784,932, mail date Aug. 23, 2011, 8 pages.
Notice of Allowance for U.S. Appl. No. 12/286,207, mail date Oct. 6, 2011, 8 pages.
Request for Continued Examination with Amendment for U.S. Appl. No. 11/732,982, mail date Aug. 22, 2011, 9 pages.
Office Action for U.S. Appl. No. 11/732,982, mail date Sep. 14, 2011, 13 pages.
Terminal Disclaimer for U.S. Appl. No. 11/732,981, mail date May 16, 2011, 1 page.
Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/RAMS/no_1604/golubev/golubev.pdf.
Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.
Mysen, B. et al. Silicate Glasses and Melts, vol. 10: Properties and Structure (Developments in Geochemistry) (Book Description), website: http://www.amazon.com/Silicate-Glasses-Melts-Developments-Geochemistry/dp/0444520112, 4 pgs.
Nascimento, M. L. F., et al. Universal curve of ionic conductivities in binary alkali silicate glasses, Journal of Materials Science (2005), Springer Science + Business Media, Inc., website: http://www.springerlink.com/content/p7535075x1872016/, 3 pgs.
Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract only) website: http://pubs.acs.org/doi/abs/10.1021/cm062619r, 2 pgs.
Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02,A05.pdf, 5 pgs.
The Mixed—Alkali Effect for the Viscosity of Glasses, printed on Dec. 3, 2010 from website: http://glassproperties.com/viscosity/mixed-alkali-effect-viscosity/, 7 pages.
The Structure of Glasses. Alkali silicate glasses, printed on Dec. 3, 2010 from website: http://www.ptc.tugraz.at/specmag/struct/ss.htm, 1 page.
Office Action for U.S. Appl. No. 11/508,782, mail date Sep. 2, 2010, 14 pages.
Office Action for U.S. Appl. No. 11/732,981, mail date Oct. 6, 2010, 10 pages.
Office Action for U.S. Appl. No. 11/959,225, mail date Oct. 27, 2010, 12 pages.
Office Action for U.S. Appl. No. 11/784,932, mail date Nov. 10, 2010, 10 pages.
Notice of Allowance for U.S. Appl. No. 11/784,158, mail date Nov. 29, 2010, 8 pages.
U.S. Appl. No. 12/286,207, filed Sep. 29, 2008, Lower et al.
U.S. Appl. No. 12/240,775, filed Sep. 29, 2008, Lower et al.
U.S. Appl. No. 12/284,670, filed Sep. 24, 2008, Cripe et al.
U.S. Appl. No. 12/116,126, filed May 6, 2008, Lower et al.
U.S. Appl. No. 11/959,225, filed Dec. 18, 2007, Lower et al.
U.S. Appl. No. 11/784,932, filed Apr. 10, 2007, Lower et al.
U.S. Appl. No. 11/784,158, filed Apr. 5, 2007, Lower et al.
U.S. Appl. No. 11/732,982, filed Apr. 5, 2007, Boone et al.
U.S. Appl. No. 11/732,981, filed Apr. 5, 2007, Wilcoxon et al.
U.S. Appl. No. 11/508,782, filed Aug. 23, 2006, Lower et al.

Click et al., "SCHOTT Low Temperature Bonding for Precision Optics," website: http://optics.nasa.gov/tech_days/tech_days_2004/docs/18%20Aug%202004/23%20Schott%20Low%20Temperature%20Bonding.pdf, 20 pages.

Final Office Action for U.S. Appl. No. 11/508,782, dated Jun. 16, 2009, 14 pages.

International Search Report and Written Opinion for Application No. PCT/US2008/074224, mail date Jan. 30, 2009, 10 pages.

International Search Report and Written Opinion for Application No. PCT/US2008/075591, mail date Apr. 8, 2009, 7 pages.

Lewis, J. A. et al., Materialstoday: Jul./Aug. 2004, "Direct writing in three dimension," ISSN: 1369 7021 © Elsvier Ltd 2004, pp. 32-39.

Non-Final Office Action for U.S. Appl. No. 11/784,158, dated Oct. 8, 2009, 7 pages.

Non-Final Office Action for U.S. Appl. No. 11/784,158, dated Apr. 21, 2009, 11 pages.

Non-Final Office Action for U.S. Appl. No. 11/784,932, dated Apr. 3, 2009, 9 pages.

Optomec® Systems M3D® Breakthrough Technology for Printable Electronics, pp. 1-2.

PQ Corporation, "Bonding and Coating Applications of PQ® Soluble Silicates," Bulletin 12-31, (2003), 7 pages.

PQ Corporation, "PQ® Soluble Silicates in Refractory and Chemical-Resistant Cements," Bulletin 24-1, (2003), 6 pages.

Thresh, The Action of Natural Waters on Lead, The Analyst, Proceedings of the Society of Public Analysts and Other Analytical Chemists, Nov. 1922, pp. 459-468, vol. XLVII, No. 560.

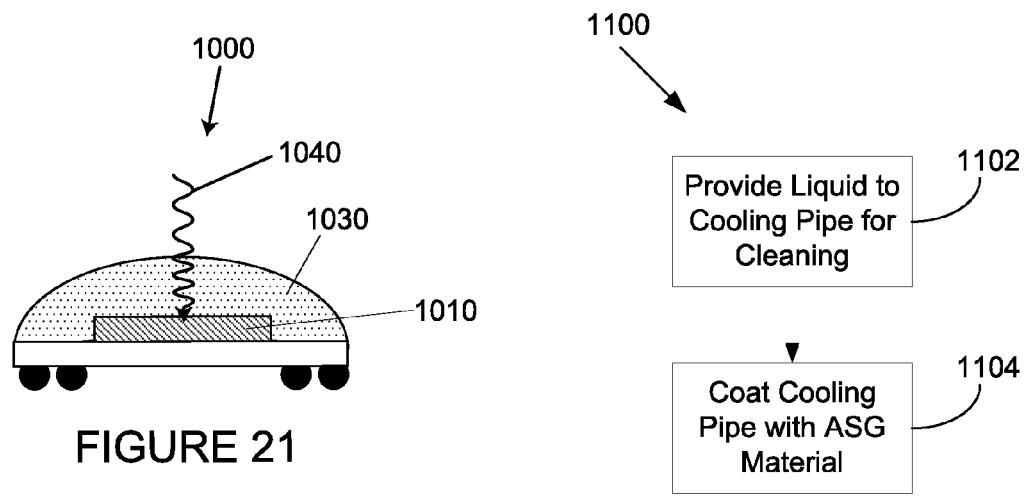
FIGURE 21
FIGURE 22
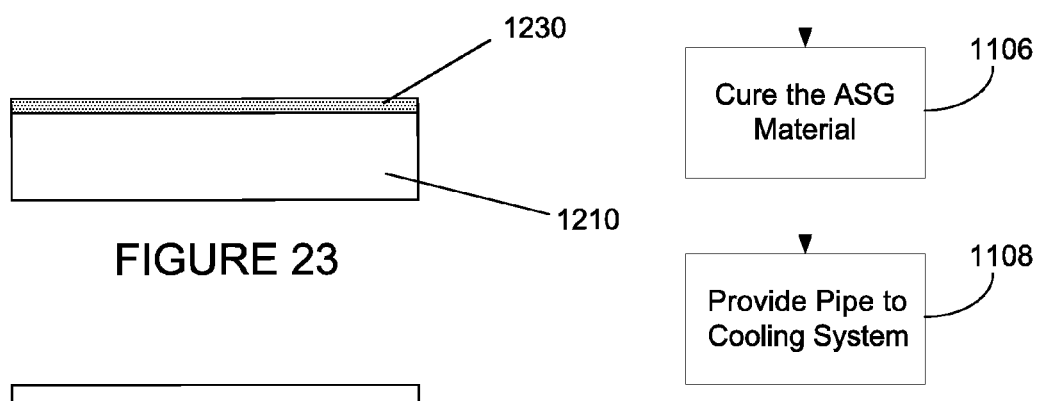
FIGURE 23
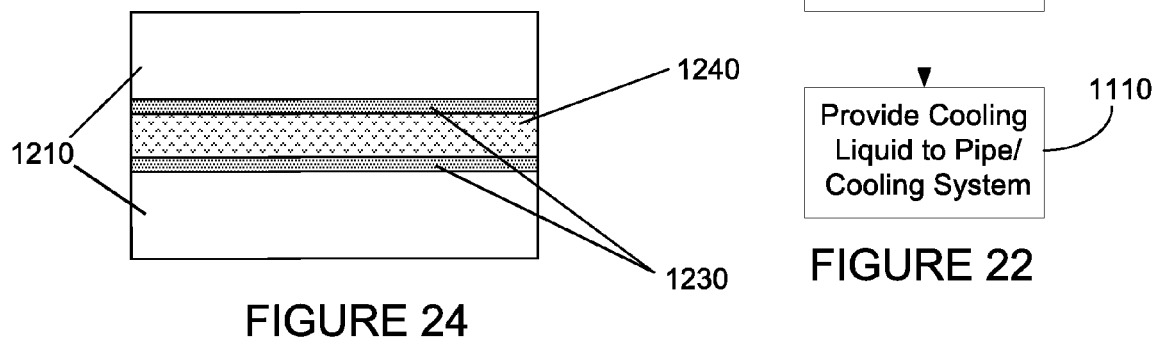
FIGURE 24

ALKALI SILICATE GLASS FOR DISPLAYS

CROSS-REFERENCE TO RELATED APPLICATIONS

This application is a continuation-in-part of prior application Ser. No. 11/959,225, filed Dec. 18, 2007, which is herein incorporated by reference in its entirety. This application is a continuation-in-part of prior application Ser. No. 12/240,775, filed Sep. 29, 2008, which is herein incorporated by reference in its entirety. This application is related to U.S. patent application Ser. No. 11/508,782, filed Aug. 23, 2006, U.S. patent application Ser. No. 11/784,158, filed on Apr. 5, 2007, U.S. patent application Ser. No. 11/732,982, filed on Apr. 5, 2007, U.S. patent application Ser. No. 11/732,981, filed on Apr. 5, 2007, U.S. patent application Ser. No. 11/784,932, filed on Apr. 10, 2007, U.S. application Ser. No. 12/116,126, filed on May 6, 2008, PCT Application No. PCT/US2008/074224, filed on Aug. 25, 2008, and PCT Application No. PCT/US2008/075591, filed on Sep. 8, 2008, the entire disclosures of which are incorporated herein by reference.

BACKGROUND

Displays pose a variety of design challenges, particularly when they are intended for use in harsh environments or military applications. Scratch resistance, anti-reflection, protection against contaminants, ease of manufacturability, durability, and other issues can be addressed during the design of a display.

SUMMARY

According to one exemplary embodiment, a display assembly comprises an electronic display element, a transparent material over the electronic display element, and an alkali silicate glass at least partially covering at least one of the electronic display element or the transparent material.

According to another exemplary embodiment, a display assembly comprises an electronic display element, a layer of material, and an alkali silicate glass material at least partially covering at least one of the electronic display element and the layer of material.

According to another exemplary embodiment, a display assembly comprises a display element, a glass material, a polymer material, and an alkali silicate glass material between the glass material and the polymer material, wherein the display element provides illumination through the glass material.

According to another exemplary embodiment, a filter for a display comprises a polymer film and an alkali silicate glass layer covering at least a portion of the polymer film.

BRIEF DESCRIPTION OF THE DRAWINGS

The disclosure will become more fully understood from the following detailed description, taken in conjunction with the accompanying drawings, wherein like reference numerals refer to like elements, in which:

FIG. 21 is a schematic cross-sectional view of a circuit produced according to the method of FIG. 18 according to another exemplary embodiment.

FIG. 22 is a flow diagram illustrating the steps in a method for coating a cooling pipe according to an exemplary embodiment.

FIG. 23 is a schematic cross-sectional view of a coated surface produced according to the method of FIG. 18 or FIG. 21 according to an exemplary embodiment.

FIG. 24 is a schematic cross-sectional view of a coated surface produced according to the method of FIG. 18 or FIG. 21 according to another exemplary embodiment.

DETAILED DESCRIPTION OF THE EXEMPLARY EMBODIMENTS

Figure 1:
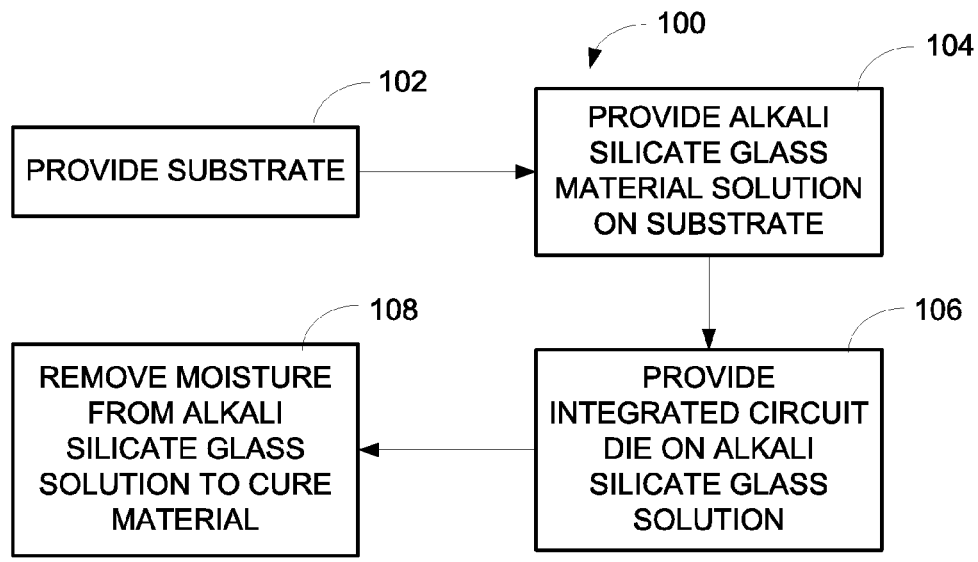
FIG. 1 is a flow diagram illustrating the steps in a method for producing an integrated circuit assembly according to an exemplary embodiment.

According to some embodiments, moisture diffusion into polymer and/or flexible displays, such as OLEDs, can be reduced or eliminated by the use of ASG material as an external barrier. According to some embodiments, protection of one or more display components against moisture, oxygen, etc. can be provided. According to some embodiments, the useful life of some display components can be extended.

According to some embodiments, improved moisture protection and/or improved adhesion can be provided in spaces between components of a liquid crystal display assembly. According to some embodiments, adhesion between polymer and glass surfaces can be improved. According to some embodiments, lower cost adhesives may be used to bond polymer film to glass. According to some embodiments, a wider range of adhesive materials may be used to adhere filters, polarizers, privacy screens, etc. (which are typically fabricated on polymer films) to glass. According to some embodiments, the mechanical, optical, or other characteristics of a surface of or in a display may be altered or modified to achieve better performance, higher reliability, and/or lower cost as compared to conventional methods.

According to some embodiments, the outer sheet of a touch screen can have improved durability and/or scratch resistance, and the thickness of the layer can be adjusted to control the deflection force required for contact. According to some embodiments, optical diffusers can be provided, Moire effect between stacked displays (e.g., stacked LCDs) can be reduced, anti-reflective coatings can be provided, and other advantageous features may be provided.

According to an exemplary embodiment, an alkali silicate glass material is used as a material for coupling or joining one or more electronic components together (e.g., in place of more conventional adhesive materials such as an epoxy-based die attach material), for coating the one or more electronic components, or for coating another surface. The alkali silicate glass material is provided in the form of a liquid solution that is provided between the surfaces of two components to be joined together. The solution is then cured to remove the water, which leaves a solid, moisture-impermeable material that adheres the two surfaces together.

The alkali silicate glass material advantageously exhibits dielectric material properties that are similar to or better than polymer based adhesive materials. In contrast to more traditional adhesive materials, however, the alkali silicate glass materials are relatively resistant to moisture (i.e., the material generally will not absorb moisture), which makes such materials suitable for use in environments in which humidity absorption can degrade the mechanical properties of the substrate and/or modify its electrical characteristics.

According to an exemplary embodiment, an alkali silicate material is provided in solution with a liquid such as deionized water, after which the water is removed from the solution such that the remaining alkali silicate glass material may act to couple or join two or more electronic components together. The solution may include one or more alkali silicates, such as lithium, sodium, potassium, rubidium, cesium, or francium silicate materials. The solution may include a single type of alkali silicate (e.g., lithium silicate) or more than one type (e.g., a 1:1 molar ratio of lithium silicate and potassium silicate or a 1:1 molar ratio of lithium silicate and sodium silicate).

Liquid alkali silicate solutions are commercially available from companies such as PQ Corporation of Malvern, Pa. in a wide variety of $SiO_2$ to $M_2O$ weight ratios (this ratio may be referred to as the "R value" for the solution). For example, solutions having R values of between 1.00 and 3.5 or greater than 3.5 may be obtained or created by dissolving additional silica into aqueous alkali silicate solutions. These solutions may be used as-is or may be further modified (e.g., by adding deionized water to the solution, by adding particles to modify its thermal expansion coefficient or other characteristics, etc.). The particular materials utilized may vary depending on the desired application, material properties, and other factors according to various exemplary embodiments.

Highly siliceous liquid alkali silicate solutions tend to air dry rapidly, are the most refractory (high melting temperature), and are the most resistant to acids and corrosion. These silica rich liquid solutions tend to contain more water than alkaline rich solutions (per similar viscosity), and thus undergo greater shrinkage while curing. Low silicate ratio, alkaline rich, solutions tend to have greater elasticity, lower brittleness, and less shrinkage but may exhibit poor corrosion resistance. These low ratio coatings also dry more slowly because their alkali content creates a greater affinity for water. Many chemically resistant cements and mortars are produced using high ratio (e.g., approximately 3.25) alkali silicate solutions. Alternatively, high alkali ratio silicate solutions may be doped with filler materials to produce a composite that has excellent moisture and corrosion resistance as compared to the undoped material.

In order for the alkali silicate materials to become moisture impermeable and relatively insoluble, the water must be nearly completely removed from the solution. The alkali silicate solutions may be cured at relatively low temperatures (e.g., less than or equal to 160 degrees Celsius, and between approximately 95 and 100 degrees Celsius according to a particular exemplary embodiment) to remove the water and solidify the material, thereby reducing residual stresses and processing costs. According to other exemplary embodiments, curing temperatures of greater than 160 degrees Celsius may be utilized. According to still other exemplary embodiments, curing temperatures of less than 100 degrees Celsius may be used as desired (e.g., air drying may remove a sufficient degree of moisture from the material for a particular application, particularly in environments where there is not substantial ambient humidity). For example, according to one exemplary embodiments, an alkali silicate solution may be cured at a temperature of between approximately 120 and 160 degrees Celsius for a period of between approximately 120 and 240 minutes to remove the water therefrom (although it should be understood that different curing times and temperatures may be used according to various other exemplary embodiments). It is intended that once cured, the material will advantageously be capable of withstanding high temperatures (e.g., up to a glass transition temperature of approximately 700 degrees Celsius).

The alkali silicate glass material may include one or more types of fillers (e.g., particles) added thereto so as to provide enhanced electrical and/or thermal conduction for the material (e.g., to allow for electrical interconnection between the electronic components through the material) or alternatively to provide enhanced electrical and/or thermal insulation. The alkali silicate glass material may also include materials therein for altering or modifying the thermal expansion characteristics of the material to allow it to better match the thermal expansion characteristics of the components to which it is coupled.

For example, high thermal conductivity particles, such as, but not limited to, diamond, aluminum nitride, beryllium oxide, or metals may be added to the solution prior to curing to improve the thermal conductivity of the resulting alkali silicate glass material. One possible application for such a material may be as a material for joining a heat spreader or similar component to another electronic component to remove heat from the electronic component.

Particles may also be added to modify the thermal expansion coefficient of the material. For example, a coefficient of thermal expansion (CTE) matching filler such as glass, ceramics, metals, or polymers may be added to the solution to modify the CTE of the final material, which may increase the utility of the material in applications such as underfills for flip-chip devices. This may improve its thermal cycle and shock loading reliability for high-temperature underfill applications (of greater than approximately 200 degrees Celsius). Current underfills, which are typically epoxy-based, are limited to relatively low operating temperatures (e.g., less than approximately 200 degrees Celsius) due to the fact that organics may decompose at higher temperatures.

The particles may be electrically and thermally conductive (e.g., metals, various forms of carbon, and some semiconducting ceramics) according to an exemplary embodiment. According to other exemplary embodiments, the particles may be electrically insulating but thermally conductive (e.g., diamond, aluminum nitride, beryllium oxide, etc.).

According to another exemplary embodiment, the alkali silicate glass material may include nanoparticle modifiers, including, but not limited to, nano calcium carbonate, nano zinc oxide and nano silicon dioxide. Aqueous alkali silicate composite solutions applied on or between surfaces of materials, dry to form a tough, tightly adhering inorganic bond that exhibits many desirable characteristics.

According to an exemplary embodiment, the alkali silicate glass material may be used as to couple or join two or more components together in an electronics package (e.g., in a wire-bonded or flip chip integrated circuit assembly). Various exemplary embodiments illustrating the use of the alkali silicate glass material in this manner are described below.

Figure 2:
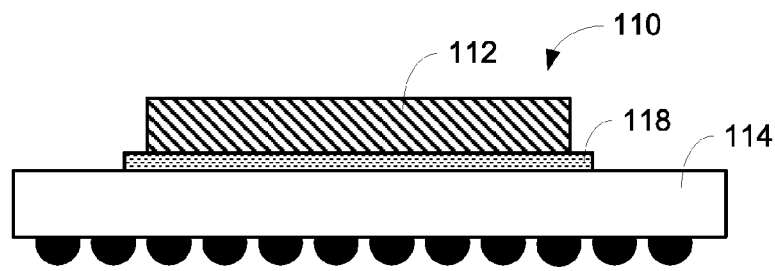
FIG. 2 is a schematic cross-sectional view of an integrated circuit assembly produced according to the method described with respect to FIG. 1 according to an exemplary embodiment.

FIG. 1 is a flow diagram illustrating steps in a method 100 for producing an integrated circuit assembly 110 according to an exemplary embodiment. FIG. 2 is a schematic cross-sectional view of an integrated circuit assembly 110 produced according to the method described with respect to FIG. 1.

As shown in FIG. 2, an integrated circuit 112 is coupled or joined to a substrate 114 (e.g., a silicon, alumina, aluminum nitride, silicon-germanium, or other type of suitable substrate) with an alkali silicate glass material 118. In this manner, the alkali silicate glass material 118 is intended to take the place of a conventional adhesive (e.g., an organic adhesive) that may be used to join the integrated circuit 112 to the substrate 114.

Figure 3:
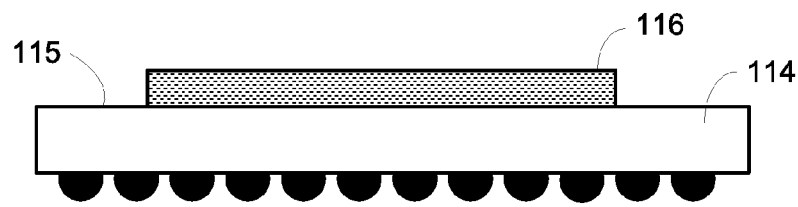
FIG. 3 is a schematic cross-sectional view of a substrate having an alkali silicate material solution provided thereon according to the method of FIG. 1.

In a step 102 of the method 100, the substrate 114 is prepared and provided for assembly, after which an alkali silicate glass material solution 116 is provided on a top surface thereof in a step 104 as illustrated in FIG. 3. According to an exemplary embodiment, the alkali silicate glass material solution 116 has a viscosity similar to that of liquid water. The thickness of the solution as provided may vary depending on the application and the material used. For example, if particle fillers are added to the alkali silicate solution, the minimum bond thickness may be limited by the size of the particles used. Where no particles are added, the bond thickness may be as low as desired (e.g., as low as approximately 200 nanometers). It should be understood that the viscosity and thickness of the solution may vary according to other exemplary embodiments.

According to an exemplary embodiment, the alkali silicate glass material solution 116 includes relatively small (e.g., between approximately 2 and 10 micrometer diameter) electrically conductive particles (e.g., particles of silver, tin, metal coated polymers, and/or other conductive materials) to allow it to be used as an anisotropically conductive adhesive (ACA) material that both mechanically bonds two surfaces together and provides electrical connection between locations on the surfaces. When the two horizontal surfaces are held against each other, the electrically conductive particles provide vertical electrical interconnect between aligned electrical pads, but because the radial distance between adjacent pads is much larger than the vertical distance between pads on the two surfaces, adjacent pads are not electrically connected. ACA's typically utilize an organic material as the adhesive, which limits their suitability in harsh environments. The use of the alkali silicate glass material 118, with appropriate electrical particles interspersed therein, is intended to provide an ACA that is less susceptible to moisture and corrosion. This material could then be used to provide the electrical interconnect and act as a mechanical underfill for flip chip attached components, for example, as described below with respect to FIGS. 5-8.

Figure 4:
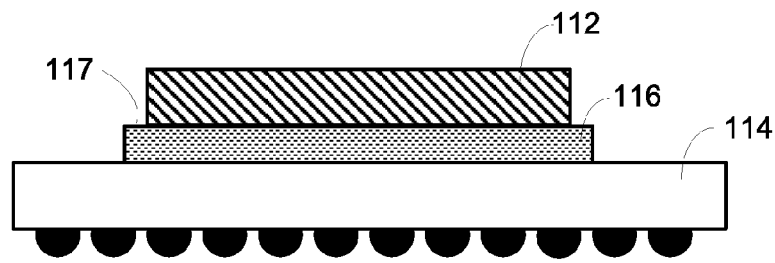
FIG. 4 is a schematic cross-sectional view of a substrate having an alkali silicate material solution and an integrated circuit die provided thereon according to the method of FIG. 1.

After the alkali silicate glass material solution 116 is provided, the integrated circuit die 112 is provided on a top surface 117 of the alkali silicate glass material solution 116 in a step 106 as shown in FIG. 4.

In a step 108 illustrated in FIG. 2, to permanently couple or join the integrated circuit die 112 to the substrate 114, the alkali silicate glass material solution 116 is cured at a relatively low temperature (e.g., less than or equal to approximately 160 degrees Celsius for a period of between approximately 120 and 240 minutes) to remove the moisture therefrom. The amount of shrinkage (if any) of the material will depend on the material used and other factors. For example, materials that include particles provided therein may be more resistant to shrinkage than those that do not.

Figure 5:
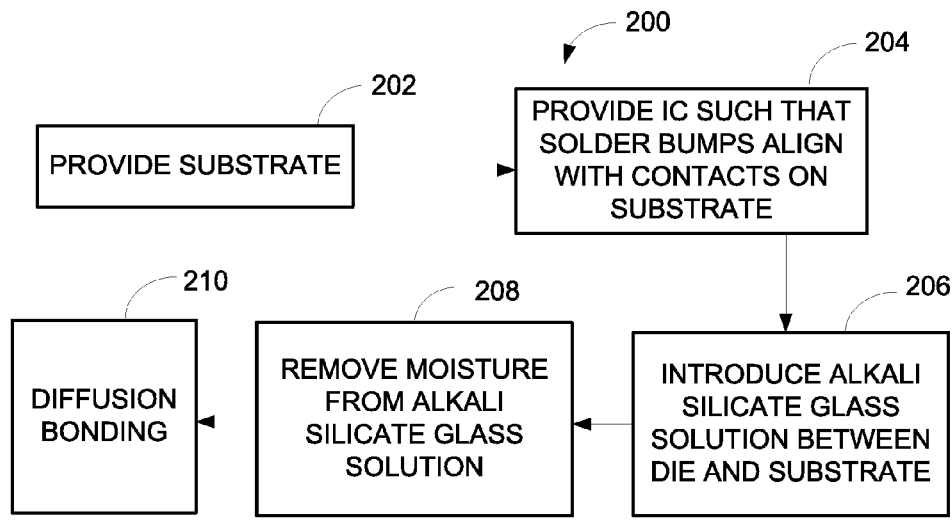
FIG. 5 is a flow diagram illustrating the steps in a method for producing a flip chip assembly according to an exemplary embodiment.
Figure 6:
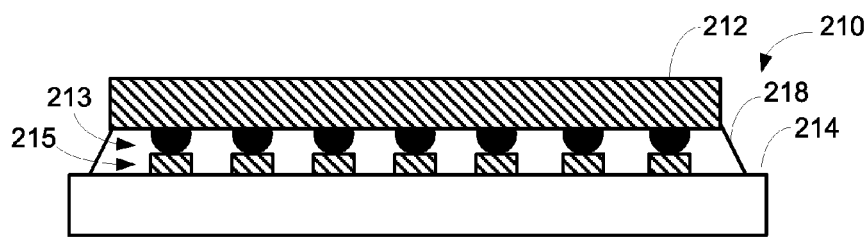
FIG. 6 is a schematic cross-sectional view of a flip chip assembly produced according to the method of FIG. 5 according to an exemplary embodiment.

FIG. 5 is a flow diagram illustrating steps in a method 200 for producing a flip chip integrated circuit assembly 210 according to another exemplary embodiment. FIG. 6 is a schematic cross-sectional view of a flip chip assembly 210 produced according to the method described with respect to FIG. 5.

Figure 7:
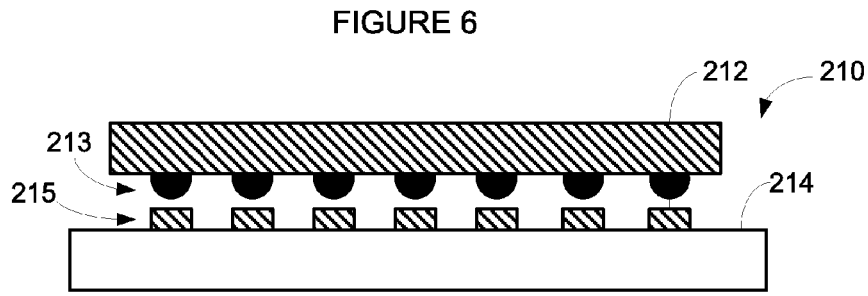
FIG. 7 is a schematic cross-sectional view of a flip chip assembly illustrating the positioning of the flip chip on a substrate in accordance with the method of FIG. 5.

As shown in FIG. 6, an integrated circuit 112 is provided in a step 202 that includes metal interconnect bumps 213 provided thereon for electrically coupling the integrated circuit 112 to an underlying substrate 214 in a flip chip configuration. As illustrated in FIG. 7, the metal bumps 213 are configured for alignment with contacts 215 provided on the substrate 214, as shown in FIG. 7. As the integrated circuit 212 is positioned on the substrate 214 in a step 204 shown in FIG. 8, the solder bumps make contact with the contacts 215 provided on the substrate 214. According to an exemplary embodiment, the metal bumps 213 and contacts 215 are formed from gold, copper, silver, tin, nickel or another metal or metal alloy.

Figure 8:
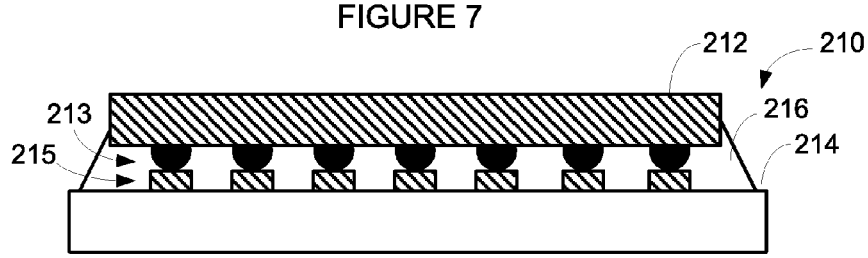
FIG. 8 is a schematic cross-sectional view of a flip chip assembly having an alkali silicate material solution introduced between a substrate and a flip chip in accordance with the method of FIG. 5.

In a step 206 shown in FIG. 8, an alkali silicate glass material solution 216 is provided as an underfill material for the flip chip assembly 210. The alkali silicate glass material solution 216 is then cured in a step 208 at a relatively low temperature (e.g., less than or equal to approximately 160 degrees Celsius) for an appropriate amount of time to remove the moisture therefrom (the curing time will depend on many factors, including, for example, the size of the device being bonded, the material used, the temperature used, and other factors).

In a step 210, diffusion bonding is performed to further couple the metal bumps 213 to the contacts 215 at a temperature of between approximately 200 and 300 degrees Celsius for a period of between approximately 3 and 5 minutes (although it should be understood that different times and temperature may be used according to other exemplary embodiments, and may vary depending on the material composition used). One advantageous feature of using the alkali silicate glass material 218 as an underfill material is that once cured, such material has a softening temperature of greater than approximately 700 degrees Celsius. Thus, during the subsequent diffusion bonding step 210, pressure is maintained between the metal bumps 213 and the contacts 215 at elevated temperatures, which is intended to speed metal diffusion required for the electrical and mechanical coupling of the components of the assembly 210.

To further enhance the diffusion bonding process, the alkali silicate glass solution 216 may include particles made from metals such as tin, silver, gold, indium, gallium, copper, nickel, bismuth, and other metals and alloys thereof. According to an exemplary embodiment, the alkali silicate glass solution 216 may include both a "parent" metal such as silver, gold, or copper as well as a low melting temperature metal such as tin, indium, gallium, bismuth, and other low melting temperature metals.

According to an exemplary embodiment, the particles (e.g., tin and silver particles) are provided at a loading volume of between approximately 10 and 70 percent. During the diffusion bonding process, the particles diffuse into the metal bumps 213 and contacts 215 to form a higher melting temperature alloy (e.g., where the metal bumps 213 and contacts 215 are formed from gold or a gold alloy, the addition of tin and/or silver produces an alloy in the interconnect bump that has a melting temperature that is higher than that of the original particles). One advantageous feature of using the alkali silicate glass to introduce tin into the diffusion bonding process is that the occurrence of metal oxidation may be reduced or eliminated (since the metal is not exposed to moisture or the ambient environment, particularly oxygen).

It should be noted that in addition to semiconductor substrates (e.g., silicon, silicon-germanium, gallium nitrogen, gallium arsenide, zinc oxide, sapphire, alumina, aluminum nitride, quartz, or other types of substrates), the method described with respect to FIGS. 5-8 may also be employed to adhere a bumped device flip chip device to a patterned indium tin oxide (ITO) coated glass material, such as that used in display technologies (it should be noted that other transparent conductive coatings may be used in display technologies, such as hydrogen impregnated alumina or other suitable materials). The relatively low curing temperatures and robustness of the cured material associated with alkali silicate glass may advantageously improve the reliability of these devices fabricated with chip on glass assembly processes.

It should also be noted that the examples described with respect to FIGS. 1-8 may also be applied to stacked die packaging assembly processes that utilize through silicon vias (TSVs) in which vias within an integrated circuit allow interconnections to be made between the active surface of the die and the back side of the die. Advantageous features of the alkali silicate glass material such as its relatively low coefficient of thermal expansion, moisture impermeability, and low temperature processing make this material particularly well-suited for multiple-die applications.

According to another exemplary embodiment, the alkali silicate glass material may include filler materials to enhance the thermal and/or electrical conductivity of the material. For example, an alkali silicate glass material may include filler materials such as diamond, aluminum nitride, beryllium oxide, silicon carbide, carbon nanotubes, graphite, pyrolytic graphite, metal fillers, or other suitable filler materials at a suitable volume loading (e.g., between approximately 50 and 90 percent). It should be understood that the material and volume loading may differ according to other exemplary embodiments depending on the particular application and desired performance characteristics. One advantageous feature of utilizing filler materials is that the resulting alkali silicate glass material may act both as a mechanical die attach material as well as a thermally and/or electrically conductive die attach material. Such filler materials may be used in conjunction with the alkali silicate glass material in conjunction with organic substrates, ceramic substrates, and stacked technologies such as silicon substrates or other devices.

Figure 9:
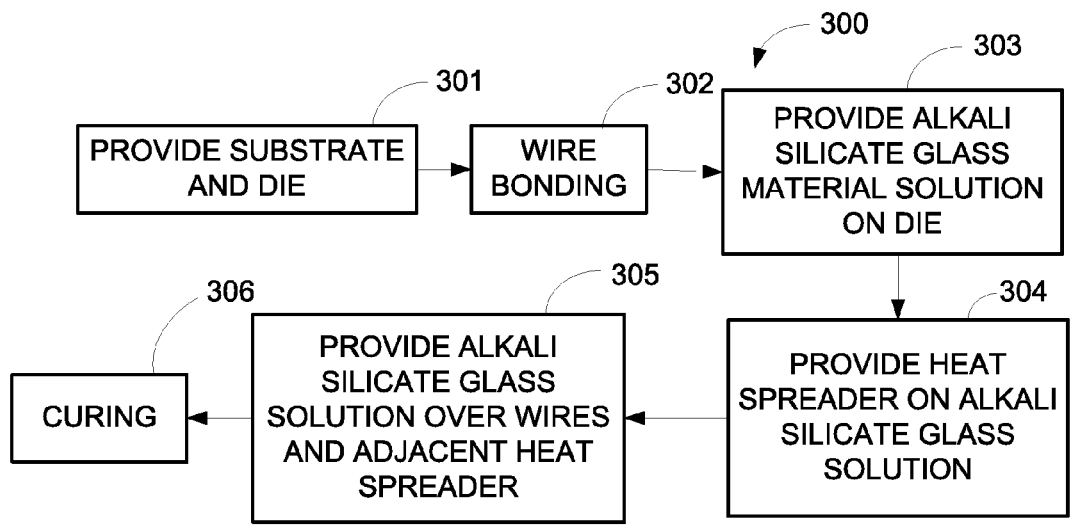
FIG. 9 is a flow diagram illustrating the steps in a method for producing an integrated circuit assembly according to another exemplary embodiment.
Figure 10:
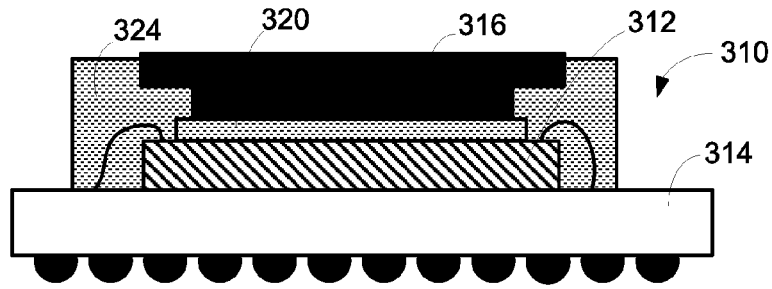
FIG. 10 is a schematic cross-sectional view of an integrated circuit assembly produced according to the method of FIG. 9 according to an exemplary embodiment.

FIG. 9 is a flow diagram illustrating steps in a method 300 for producing a wire bonded integrated circuit assembly 310 according to another exemplary embodiment. FIG. 10 is a schematic cross-sectional view of a wire bonded integrated circuit assembly 310 produced according to the method described with respect to FIG. 9. As shown in FIG. 10, the assembly 310 includes an integrated circuit die 312 provided on a substrate 314 in accordance with a step 301. A heat spreader 316 is provided above and coupled to the integrated circuit die 312.

Figure 11:
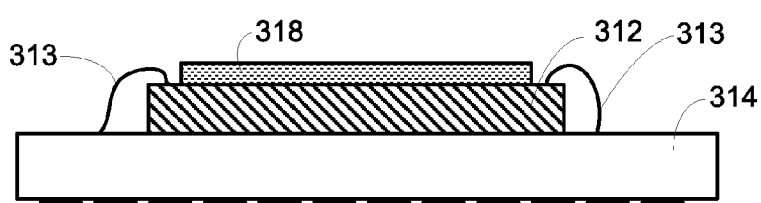
FIG. 11 is a schematic cross-sectional view of a substrate having an integrated circuit die and an alkali silicate material solution provided on the die according to the method of FIG. 9.

As shown in FIG. 11, in a step 302, a wire bonding operation is performed to electrically couple the integrated circuit die 312 to the substrate 314. Wires 313 may be made of any suitable electrically conductive material as is well known in the art.

In a step 303, an alkali silicate glass solution 318 is provided on the active side of the wire bonded integrated circuit 312. According to an exemplary embodiment, the alkali silicate glass solution 318 includes thermally conductive dielectric particles therein (e.g., diamond, etc.).

Figure 12:
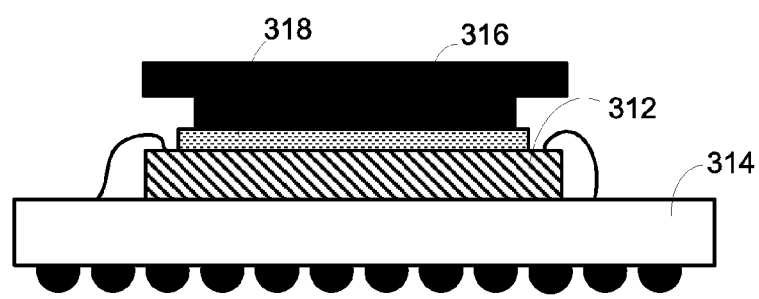
FIG. 12 is a schematic cross-sectional view of a substrate having an integrated circuit die and a heat spreader provided thereon according to the method of FIG. 9.
Figure 13:
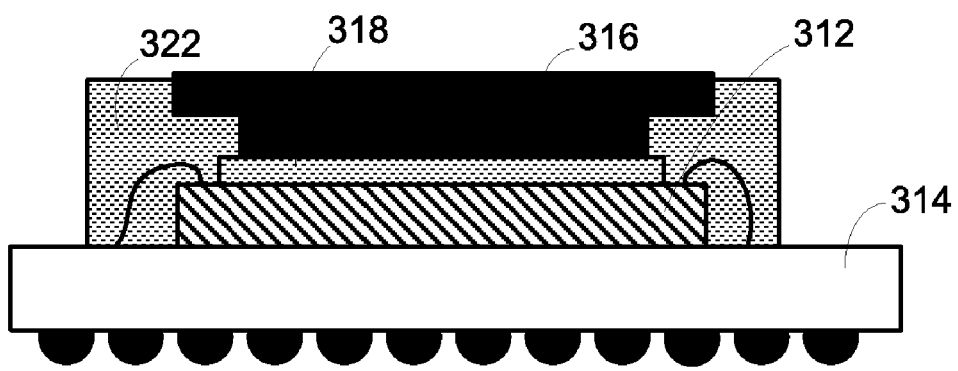
FIG. 13 is a schematic cross-sectional view illustrating the provision of an alkali silicate solution according to the method of FIG. 9.

A heat spreader 316 is provided in contact with the alkali silicate glass solution 318 in a step 304, as shown in FIG. 12, after which a second alkali silicate glass solution 322 is provided in a step 305 to encapsulate a portion of the assembly 310, as shown in FIG. 13. The alkali silicate glass solutions 318 and 322 are subsequently cured to remove the moisture therefrom, which results in solid alkali silicate glass regions 320 and 324. According to other exemplary embodiments, the alkali silicate glass solutions 318 and 322 may be cured in separate curing steps and/or the alkali silicate glass solutions 322 may be replaced with another type of encapsulation material such as epoxy-based materials.

As shown in FIG. 10, after the heat spreader 316 is attached to the integrated circuit die 312, the outer surface of the heat spreader 316 remains exposed for easy attachment to the next portion of the thermal path, such as the package lid, a finned heat sink, a heat pipe, or the like. The resulting device would be similar to a Quad Flatpack No Lead (QFN) or a flip chip device with an integrated heat spreader, except that the heat would not have to travel through the integrated circuit to go from the active surface to the heat spreader.

According to other exemplary embodiments, the alkali silicate glass materials may be used in a process to adhere two surfaces together to create a hermetic seal. For example, such material may be used to provide a low cost hermetic packaging method for devices that would otherwise use a glass frit, diffusion bonding, or welding. In addition to being lower cost, it would also be performed at much lower temperatures, making it suitable for devices such as MEMS and other products that require low temperature possessing.

Figure 14:
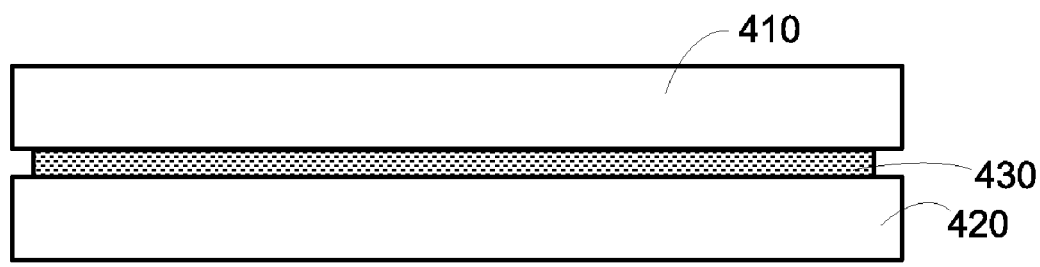
FIG. 14 is a schematic cross-sectional view illustrating two wafers or integrated circuit dies coupled together using an alkali silicate glass material according to an exemplary embodiment.

According to other exemplary embodiments, the alkali silicate glass material may be used to couple or attach integrated circuit wafers together as part of a Wafer Level Packaging (WLP) assembly process, as illustrated in FIG. 14, which illustrates two wafers 410 and 420 coupled together using an alkali silicate glass material 430. According to another exemplary embodiment, an alkali silicate glass material may be used to couple two integrated circuit dies together (as shown in FIG. 14, the wafers may be substituted with integrated circuit dies).

As will be appreciated by those reviewing the present disclosure, the use of alkali silicate glass materials to couple or join components of integrated circuit assemblies together provides various advantages over currently known technologies. For example, the relatively low moisture absorption and high chemical resistance of the cured alkali silicate glass provides enhanced long term reliability when used in harsh (humid, high temperature, corrosive, etc.) environments such as that experienced in avionics. Chemically inert particles can be added to the adhesive to modify its thermal expansion coefficient and thermal conductivity. Particles can also be added to modify the electrical properties of the material and/or to facilitate diffusion bonding when an alloying element is incorporated therein. Advantageously, the material may be cured at relatively low temperatures, which prevents damage to the surrounding components in the device.

According to various exemplary embodiments, the alkali silicate glass (ASG) composite can be used as a hermetic thermal coating and has dielectric material properties similar to or better than conventional coating materials. Once cured, the material may not absorb moisture, making it suitable for use in harsh environments in which humidity absorption can degrade mechanical properties of the coating and/or modify its performance. The material can be cured at low temperatures (e.g., 150° C. or less), thereby reducing residual stresses and processing costs. Filler materials can be added to the material to control the thermal expansion coefficient and give the material much higher thermal conductivity than can be achieved with conventional ceramic substrate materials. Coatings of ASG based materials can be robust, easily applied, and mixed with other materials to form a composite material. The composite can be tailored to create a barrier between the surfaces they are in contact with and their surroundings. The ASG based coating may also act as a medium for particles that modify an energy flux. ASG based materials can be used to create a barrier coating on a surface to prevent, or at least reduce, interactions with the environment around it (e.g., protection against moisture).

According to various exemplary embodiments, an alkali silicate glass composite can be used as a coating material in numerous applications including, but not limited to, electronics packaging. The low moisture absorption and high chemical resistance of the composite may greatly improve the long term reliability of the product when used in harsh environments (e.g., humid, high temperature, corrosive, etc.) such as those experienced by avionics. Chemically inert particles can be added to the coating to modify the thermal expansion coefficient and thermal conductivity. Particles can also be added to modify other properties (e.g., electrical properties) of the material as desired for any given application.

Figure 15:
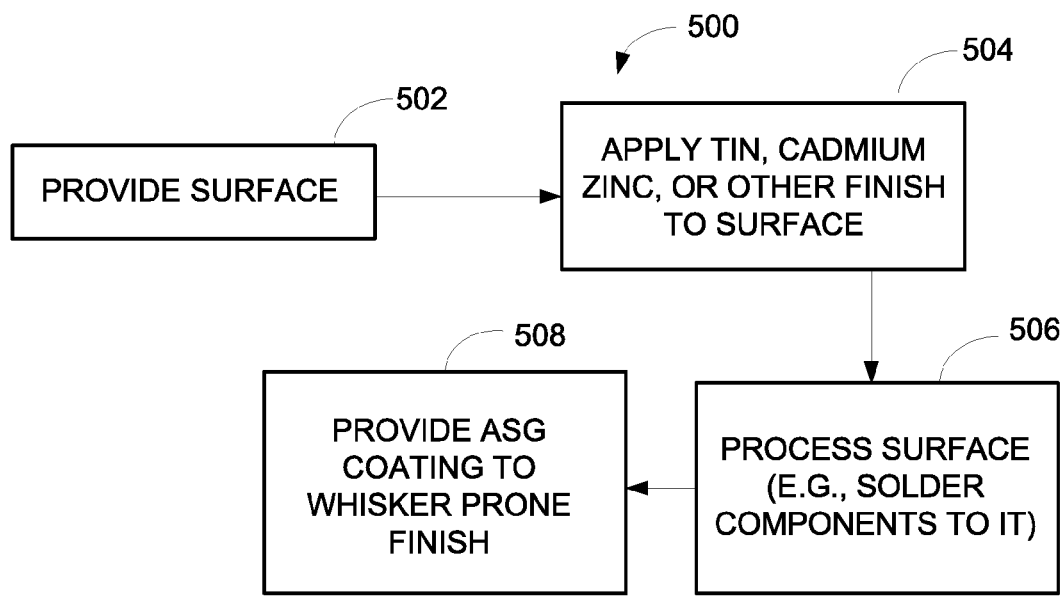
FIG. 15 is a flow diagram illustrating the steps in a method for making a protected surface according to another exemplary embodiment.
Figure 16:
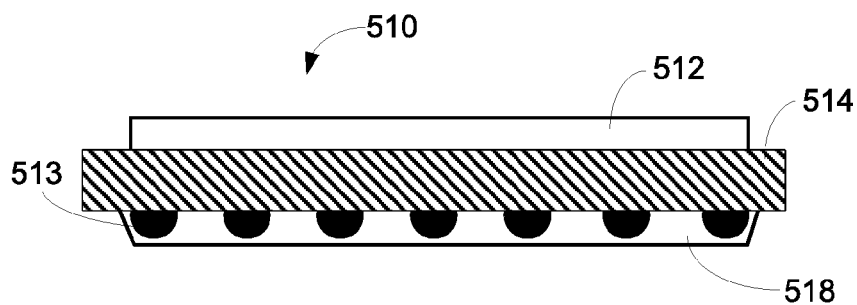
FIG. 16 is a schematic cross-sectional view of a circuit produced according to the method of FIG. 15 according to an exemplary embodiment.

Referring to FIG. 15, a process flow diagram illustrates a method 500 for making a protected surface according to an exemplary embodiment. Referring to FIG. 16, a schematic cross section illustrates an electronic assembly 510 produced by method 500 according to an exemplary embodiment. A surface 514 is provided at a step 502, for example a substrate, circuit board, a silicon wafer, another circuit, a communications port, an LED, a solar cell, a cooling pipe, or any other surface for protection. A tin, cadmium, zinc, or other finish is then applied to surface 514 at a step 504. Surface 514 is then processes at a step 506, for example, surface 514 may have at least one component 512 soldered to it. Component 512 may be any component or device capable of mounting on a surface, for example an integrated circuit, a resistor, a capacitor, a diode, a light emitting diode (LED), an inductor, a photovoltaic cell, etc. Soldering component 512 to surface 514 generally produces one or more soldering bumps or soldering joints 513. The solder may be any type of solder, for example a lead-free solder including tin, bismuth, copper, silver, indium, zinc, antimony, any combination thereof or a leaded solder. The surface finish (e.g., tin, cadmium, zinc, etc.) of the leads being soldered and the electrical interconnect to which they are soldered may be prone to whiskering and or corrosion.

An alkali silicate glass (ASG) based coating 518 is applied to solder joints, component leads, electrical interconnects, or other metallic surfaces 513 at a step 508 to at least partially cover one or more of the joints and whisker and/or corrosion prone surfaces. The ASG coating is generally configured to reduce the interaction between at least one of these metalized surfaces 513 and the environment around the surface. For example, the ASG coating may reduce the likelihood of or prevent the metal from oxidizing and/or corroding (e.g., chemical corrosion, galvanic corrosion, etc.) and increase moisture durability of the metal surface (e.g. solder joint, electrical interconnect, etc). The coating may also cover at least a portion of surface 514 and/or at least a portion of component 512 to prevent oxidation and/or increase moisture durability. The thickness of the ASG coating may be minimized to sufficiently protect the metal surfaces while being resistant to cracking and without taking up a large amount of space.

Figure 17:
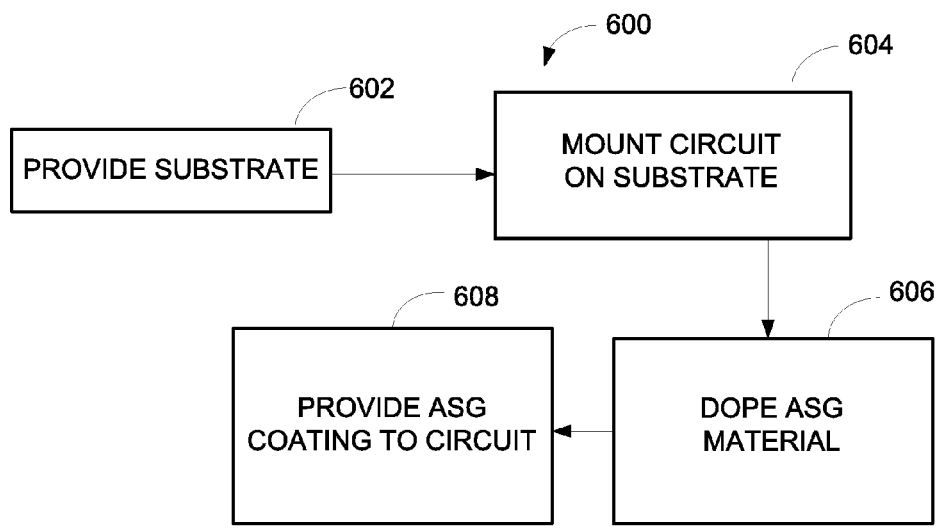
FIG. 17 is a flow diagram illustrating the steps in a method for making a circuit according to another exemplary embodiment.

Referring to FIG. 17, a process flow diagram illustrates a method 600 for making a circuit or other electronic device according to another exemplary embodiment. A substrate is provided at a step 602, for example a circuit board. An electronic device or circuit (e.g., an LED, a photovoltaic cell, and integrated circuit, etc.) is mounted on the substrate at a step 604. The mounting may include soldering the circuit to the substrate.

An ASG material is doped with a first element, dopant, or filler at a step 606. The first element is generally configured to affect the radiation that impacts the coating. For example, the dopant may affect the at least one of ultraviolet, x-ray, atomic and particle radiation, radio wave, infrared, and visible light radiation. According to various exemplary embodiments, the first element may include nano- or micro-particles, a chemical additive, ceramic particles, fluorescing particles, magnetic materials, a rare-earth material (e.g., a rare earth oxide powder, a ceramic oxide include rare earth materials, etc.), a lanthanide material, or an actinide material (e.g., depleted uranium). The ASG material may also be doped with additional elements including nano- or micro-particles, a chemical additive, fluorescing particles, magnetic materials, or a rare-earth material. According to some exemplary embodiments where a fluorescing particle is used, the fluorescing particle may be a nano-phosphor. According to other exemplary embodiments, the ASG material may be doped with diamond, aluminum nitride, boron nitride, silica, and/or alumina material. According to some exemplary embodiments, the ASG material may be doped with at least 2 molar percent of the first element.

According to other exemplary embodiments, the ASG material may be doped with between about 3 and 25 molar percent of the first element. According to still other exemplary embodiments, the ASG material may be doped with greater than about 25 molar percent of the first element. According to further exemplary embodiments, the ASG material may be doped with less than about 2 molar percent of the first element if nano- or micro-particles are used.

The doped ASG material is then used to coat a surface of the circuit at a step 608. According to various exemplary embodiments, the coating is configured to protect the circuit from environmental corrosion or oxidation due to water or moisture. According to some exemplary embodiments, the coating is also configured to block or absorb electromagnetic radiation. According to other exemplary embodiments, the coating is configured to allow electromagnetic radiation to pass through the coating. According to other exemplary embodiments, the coating may be configured to retransmit electromagnetic radiation of a first wavelength as electromagnetic radiation of a second and different wavelength. According to other exemplary embodiments, the coating may not be doped with a dopant or particle additive.

Figure 18:
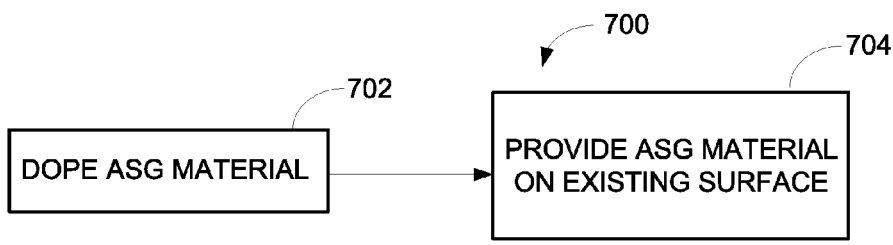
FIG. 18 is a flow diagram illustrating the steps in a method for coating a surface according to an exemplary embodiment.
Figure 19:
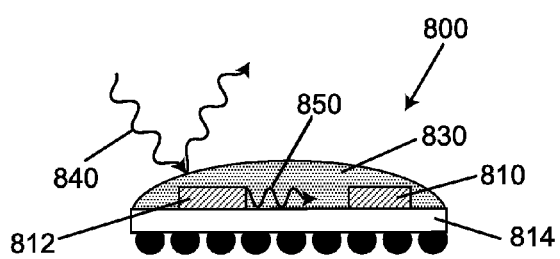
FIG. 19 is a schematic cross-sectional view of a circuit produced according to the method of FIG. 17 according to an exemplary embodiment.
Figure 20:
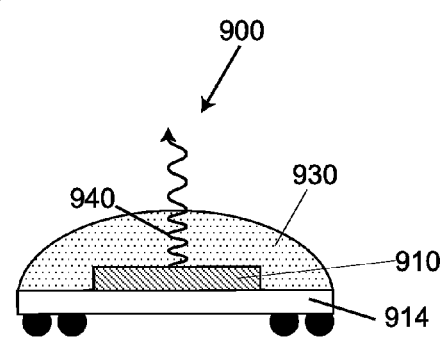
FIG. 20 is a schematic cross-sectional view of a circuit produced according to the method of FIG. 17 according to another exemplary embodiment.

Referring to FIG. 18, a flow diagram illustrates the steps in a method 700 for coating an existing surface according to an exemplary embodiment. According to the various exemplary embodiments of step 606, an ASG material is doped with an element to affect the electromagnetic radiation passing through the ASG material. The doped material can then be applied as a coating on an existing surface. For example, the ASG material can be applied to a solar cell, a window, a sealing surface between two materials, etc. in order to protect the surface from moisture or water. The ASG material can also protect the surface or object behind the surface from electromagnetic radiation. For example, a coated window may reduce the amount of ultraviolet (UV), visible, or infrared rays that pass through as well as dissipate any heat transferred by the rays. FIGS. 19-21 provide further examples of ASG coated circuits or surfaces. It is noted that according to other exemplary embodiments, the ASG coating may be formulated to provide protection without the need for doping.

Referring to FIG. 19, an electronics package 800 includes a circuit 810 and a circuit 812 mounted on a substrate 814 and at least partially encapsulated by an ASG material 830 according to an exemplary embodiment. The ASG material is doped with conductive particles for blocking or absorbing RF energy or radiation, at least partially shielding circuits 810 and 812 from radio waves. A mixed electronics device having analog circuitry (e.g., circuit 812) and digital circuitry (e.g., circuit 810) can be coated with an ASG material doped with the conductive particles in a manner configured to reduce or prevent crosstalk between the circuitry and/or electromagnetic interference from outside package 800. When used for such applications, the dopant may be metallic particles or magnetic particles at a quantity greater than 5 volume percent up to 95.1 volume percent (for quaternary (4-particle size) particle packing). The encapsulant (ASG material 830) can both physically protect the integrated circuits from moisture with a hermetic or near hermetic seal as well as reduce electromagnetic interference between components or from outside sources. For example, electronics package 800 may reflect or block an incoming RF signal 840 or absorb an RF signal transmitted by circuit 812 in the direction of circuit 810.

According to some exemplary embodiments, ASG coating 830 may also include materials to absorb atomic particles to provide radiation hardening, for example to block x-ray, atomic radiation (gamma-ray, alpha, beta, etc.), and/or UV radiation and to reduce the likelihood that circuit 810 or 812 will fail due to defect formation caused by the radiation. It is noted that according to other exemplary embodiments, the ASG coating may be formulated to provide protection without the need for doping.

Referring to FIG. 20, an electronics package 900 includes a light emitting diode (LED) 910 mounted on a substrate 914 and at least partially encapsulated by an ASG material 930 according to an exemplary embodiment. ASG material 930 may be doped with particles for spreading or diffusing visible light radiation. ASG material 930 may be doped with fluorescing particles that at least partially absorb light from LED 910 and emit or retransmit the light at a different wavelength. Certain wavelengths of light (e.g., certain colors) are difficult to generate in light emitting diodes. Multiple colors are generally needed to produce white light and the efficiency of generating each color may not be the same. According to the illustrated exemplary embodiment, ASG 930 with the integrated fluorescing particles may be excited by an LED (e.g., a highly efficient LED) to retransmit the light at a different wavelength while providing a robust coating that is generally optically clear and that can be processed at low temperatures. It is noted that according to other exemplary embodiments, the ASG coating may be formulated to provide protection without the need for doping. Similarly, specific bandwidths of light may be difficult to generate or filter, but ASG 930 with tailored particles may be used to do this.

Referring to FIG. 21, a solar panel 1000 includes at least one photovoltaic cell 1010 mounted on a substrate 1014 and at least partially coated by an ASG material 1030 according to an exemplary embodiment. ASG material 1030 is doped with particles for absorbing specific wavelengths of electromagnetic radiation 1040 and for retransmitting the radiation at a different wavelength. ASG material 1030 may coat entire solar panels to reduce or the amount of moisture (potentially resulting in corrosion and performance degradation) on solar panel 1000 while allowing solar radiation to pass through. ASG material 1030 can be used to provide increased protection from at least one of environmental corrosion due to water or moisture, UV light (e.g., from the sun), and radiation protection (e.g., for use in space or military applications). ASG material 1030 is doped with appropriate fillers, for example nano-particles or chemical additives.

According to other exemplary embodiments, fluorescing particles can be added to absorb harmful UV light and emit or retransmit useable light (e.g., visible light) to photovoltaic cell 1010 for conversion to electrical energy. ASG coating 1030 generally has an appropriate refractive index (e.g., by formulation or nano-particle additives) that can be used to create anti-reflective coatings that allow the solar cell to capture more light. ASG coatings may not significantly degrade over time or darken from UV or other radiation exposure, can provide hermetic or near hermetic protection of the surface of photovoltaic cell 1010, and can withstand high temperatures (e.g., up to about 500-600 degrees Celsius), contrary to polymer based coatings. It is noted that according to other exemplary embodiments, the ASG coating may be formulated to provide protection without the need for doping.

According to some exemplary embodiments, the coating may be chemically treated to have a specific refractive index or refractive index gradient between the substrate and air. According to other exemplary embodiments, multiple layers of glass coating having increasing or decreasing refractive index could be used.

Referring to FIG. 22, a flow diagram illustrates the steps in a method 1100 for coating a cooling pipe used to cool a device (e.g., an MRI, NMR, or other electronic device) according to an exemplary embodiment. According to various exemplary embodiments, the cooling pipe may be made of copper or another metal. The coolant traveling in the cooling pipe may be water, another liquid, or any fluid capable of transferring heat. A liquid for cleaning is provided in the cooling pipe in order to clean the interior surface of the cooling pipe at a step 1102. The cleaning solution may be a standard metal cleaner (e.g. acid, detergent, etc). After application, any residual or remaining liquid can be removed via evaporation, via heat or blown air, or otherwise.

At least a portion of the interior of the cooling pipe is then coated with an ASG material that is configured to provide a dielectric barrier at a step 1104. According to one exemplary embodiment, a galvanic junction in the cooling pipe may be coated. According to other exemplary embodiments, the interior of the entire heat exchange area of the cooling pipe may be coated. In this embodiment, the ASG material is generally a highly durable material with a high silicate content or "R value." R values (e.g., $SiO_2$ to $M_2O$ weight ratio when metal oxides are added) of the ASG material at about 4.0 or higher are expected to be particularly suitable for this application, however according to other exemplary embodiments, the ASG material may have an R value of greater than about 3.5 or greater than about 3.0. For example, a molar ratio of 1:1 of a binary alkali or silicate may be added along with a nano or micro-particle dopant to achieve the desired durability. It is noted that according to other exemplary embodiments, the ASG coating may be formulated to provide protection without the need for doping.

The ASG coating on the interior of the pipe is then cured at a step 1106 so it bonds with or adheres to the cooling pipe. The coating may be cured by blowing air through the cooling pipe (e.g., drying the coating) or by heating the coating and cooling pipe. The cured coating is generally an insulator and configured to maintain the purity of the fluid (e.g., water, refrigerant, etc.) flowing in the cooling pipe by reducing corrosion of the cooling pipes, which lead to contamination and increased conductivity of the cooling liquid. Therefore, the likelihood or degree to which the fluid flowing in the cooling pipe is conductive or contaminated may be decreased. Additionally, according to various exemplary embodiments the ASG coating may prevent or reduce oxidation of the cooling pipe during handling or exposure.

The cooling pipe with the cured ASG material is provided to or installed in a cooling system at a step 1108. The cooling liquid is provided into the cooling pipe or cooling system at a step 1110. According to various exemplary embodiments, the cooling liquid can be water, a refrigerant, another liquid, or any other fluid capable of transferring heat.

It is noted that according to other exemplary embodiments, various steps of method 1100 may be omitted or rearranged. According to some exemplary embodiments, steps 1108 and 1110 may be omitted. According to other exemplary embodiments, step 1101 may be omitted. According to still other exemplary embodiments, steps 1102, 1108, and 1110 may be omitted.

Referring to FIG. 23, a cross section of a thin ASG based coating 1230 on a metal surface 1210 (e.g., metal pipe, metal heat exchanger, etc.) for preventing or reducing the amount of oxygen contacting the metal to form a metal-oxide layer is illustrated according to an exemplary embodiment.

Referring to FIG. 24, a cross section of a thin ASG based coating 1230 around an interior of a cooling pipe 1210 (e.g., made of copper or another metal) is illustrated according to an exemplary embodiment. A cooling fluid 1240 flows in cooling pipe 1210 and across ASG based coating 1230 without contacting cooling pipe 1210, preventing or reducing the likelihood of a reaction between cooling pipe 1210 and fluid 120. According to one exemplary embodiment, the cooling fluid 1240 may be a highly corrosive liquid, such as liquid metal and the ASG based coating 1230 may prevent or reduce the likelihood that a chemical or metallurgical interaction between solid and liquid metals occurs. According to other exemplary embodiments, the fluid 1240 may be water, a refrigerant, or another type of coolant. According to various exemplary embodiments, the thickness of ASG layers 1230 may be optimized to reduce the likelihood of pinholes or lack of coverage (as with thick coatings) while exhibiting little cracking (as with thin coatings). According to one exemplary embodiment, the thickness of ASG coating 1230 may be about 1 micron. According to another exemplary embodiment, the thickness of ASG coating 1230 may be less than or greater than 1 micron.

Figure 25:
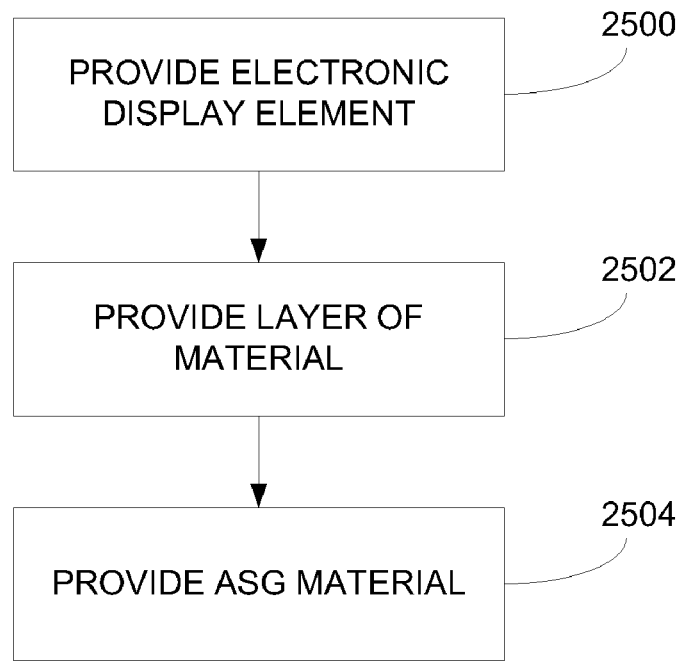
FIG. 25 is a flow diagram of a method of making a display assembly, according to an exemplary embodiment.

Referring now to FIG. 25, an exemplary method of providing a display assembly will be disclosed. At a step 2500, an electronic display element is provided. The electronic display element may be a display element, such as a light emitting diode (LED), an organic light emitting diode (OLED), a liquid crystal display, a vacuum florescent display, an active matrix liquid display, a plasma display, other display technologies, or any component of any display technology, such as an LCD material or OLED material, an indium tin oxide (ITO) element, an active component within the display, or other circuit elements used as part of a display. The display element may be rigid, semi-rigid, flexible, organic, not organic, susceptible to metallization and/or corrosion, or have other characteristics. At a step 2502, a layer of material is provided. The layer of material may be a glass, a polymer, a plastic, an organic material, a metal, a polarizing or non-polarizing material, a sealant, a filter, a screen, a film, a semiconductor material, or any other layer of material to be used as a component of the display assembly.

At step 2504, an alkali silicate glass material is provided to at least partially cover at least one of the electronic display element and the layer of material. In some embodiments, the ASG material will cover one or more electronic display elements but not one or more other layers of material, and in other embodiments, the ASG material may cover one or more layers of materials but not one or more electronic display elements. By covering the electronic display element or layer of material, the ASG material may coat, come in contact with, overlay, adhere to, or merely be provided over another layer which overlays, is in contact with, or is adhered to the electronic display element or layer of material and, thereby, cover both the intermediate layer and the electronic display element or layer of material.

Figure 26:
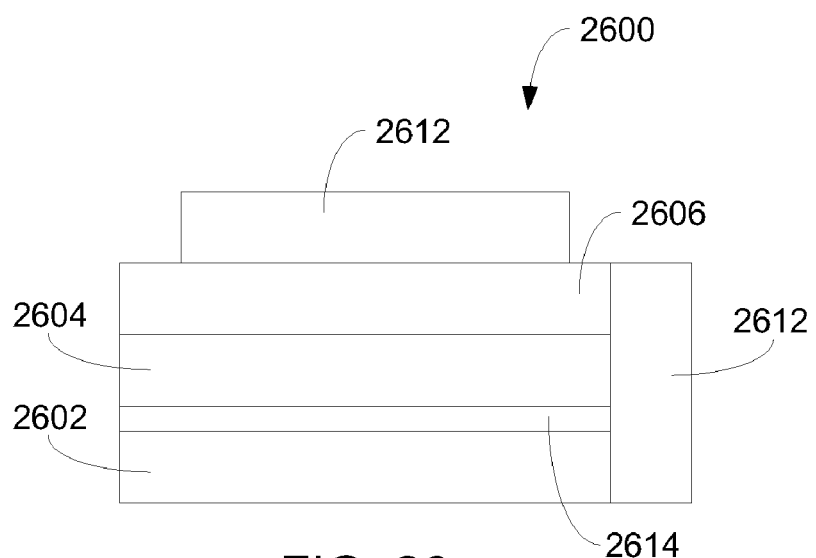
FIG. 26 is a schematic cross-sectional view of a display assembly, according to an exemplary embodiment.

Referring now to FIG. 26, a display assembly or portion thereof according to one or more embodiments will now be described. Display assembly 2600 comprises a substrate 2602, such as glass, semiconductor, or other material, and electronic display element 2604, such as a light emitting diode, an LCD material, a transistor, an ITO element, etc., and a layer of material 2606 overlaying and, in this embodiment, in contact with the electronic display element 2604. According to one embodiment, an ASG material 2608 may be provided over, on, or covering an edge 2610 of one or more of substrate 2602, electronic display element 2604, and layer of material 2606. ASG material 2608 may be configured to coat or cover edge 2610 or a portion thereof to provide protection against materials or contaminants such as moisture, oxygen, etc. that may degrade materials that make up the display.

According to another embodiment, an ASG material 2612 may be applied or disposed over layer of material 2606 to provide any of a variety of characteristics as will be described herein. According to another embodiment, an ASG material 2614 may be provided between substrate 2602 and electronic display element 2604, for such purposes as to improve adhesion bonding between element 2602 and 2604, or to provide other characteristics as will be described herein.

Figure 27:
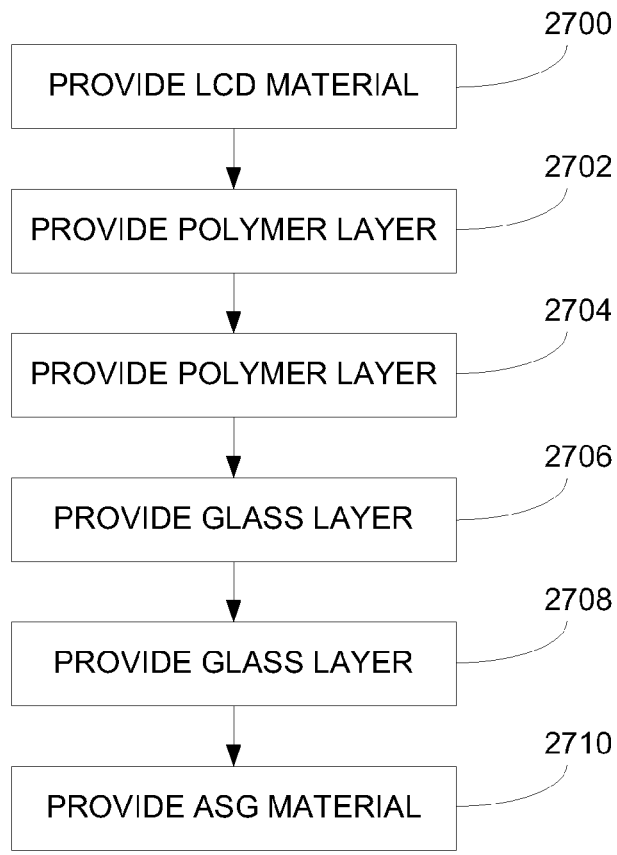
FIG. 27 is a flow diagram of a method of making a display assembly, according to another exemplary embodiment.
Figure 28:
FIG. 28 is a schematic cross-sectional view of the display assembly of FIG. 27, according to an exemplary embodiment.
Figure 29:
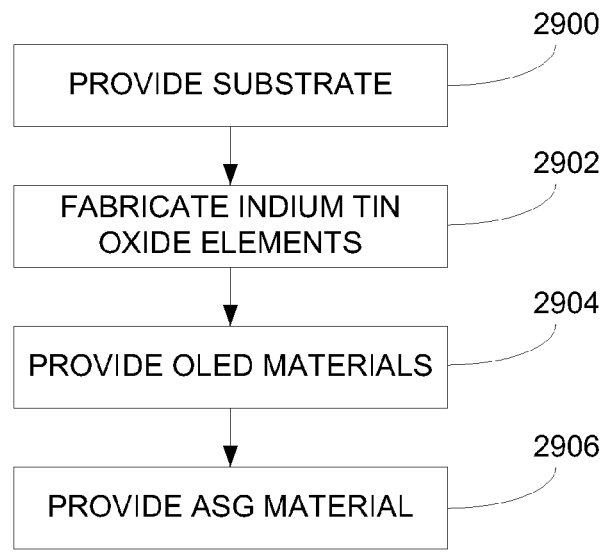
FIG. 29 is a flow diagram of a method of making a display assembly, according to another exemplary embodiment.
Figure 30:
FIGS. 30-33 are schematic cross-sectional diagrams of a display assembly, illustrating steps according to the flow diagram of FIG. 29.
Figure 31:
Figure 32:
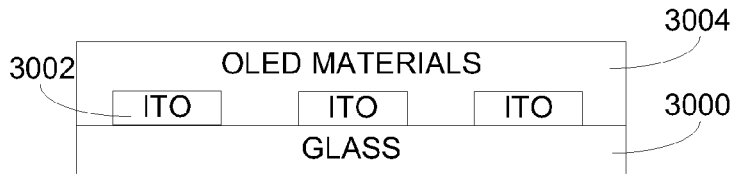
Figure 33:
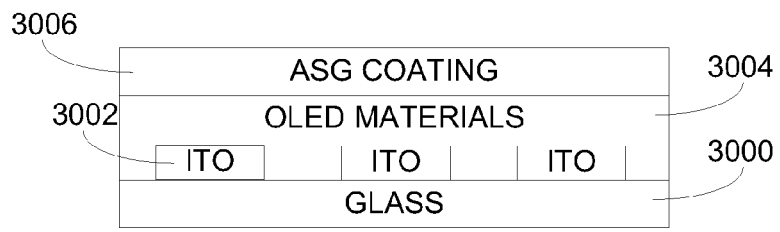

Referring now to FIGS. 27 and 28, a method and display assembly will be described according to another exemplary embodiment. At a step 2700, a liquid crystal display 2804 is provided that is comprised of two parallel substrates with a perimeter seal which contains a volume of liquid crystal material At steps 2702 and 2704 Polymer layers 2802 and 2806 are then laminated to the liquid crystal display most typically by using a roller device and applying nip pressure to the polymer layers while translating the assembly or roller device. At steps 2706 and 2708 glass layers 2800 and 2808 (substrates that are typically fabricated using fusion, extrusion, or float process) are provided over both polymer films 2802 and 2806 using established means for lamination. At step 2710 the ASG coating is applied.

FIG. 28 illustrates an LCD stack-up assembly having a number of layers, some of which may be organic and may be affected by moisture. Glass outer layers 2800 and 2808 may provide protection for the materials; however, the edges 2810 and 2812 of layers 2800-2808 may provide paths for moisture and other contaminants to the materials of the assembly, thereby allowing degradation of the display over time. In this embodiment, an ASG material 2814 is provided over a portion or all of the edges of layers 2800-2808 on one or more sides of the LCD assembly. The ASG coating 2814 may be provided in a step 2710 by wiping or spraying it along the edge and may be configured to protect display elements from at least one of moisture and oxygen by reducing or eliminating the amount of moisture and/or oxygen that comes in contact with layers 2800 through 2808 from the ambient air. ASG coating 2814 may be configured to at least partially seal edges 2810 and 2812 or portions thereof.

Referring now to FIGS. 29-33, a method and display assembly will be described in which an electronic display element comprises OLED materials and ITO elements. At step 2900, a substrate is provided, which may be a glass substrate 3000. At a step 2902, ITO elements 3002 may be fabricated on the substrate, using known deposition processes such as physical vapor deposition/sputtering or a chemical vapor deposition process Alternatively, other electrically conductive and transparent or semi-transparent materials may be used, such as carbon nanotubes, or other electronic components. At a step 2904, the OLED materials may be provided most typically by a printing process or other deposition process. At a step 2906, an ASG coating 3006 is applied or provided over OLED materials 2004 and ITO elements 3002. Organic materials used in OLEDs may be quite sensitive to moisture and oxygen. Applying a thin layer of ASG material of 0.05-5.0 microns thickness over OLED materials and/or on the edges thereof may prolong the life of the OLED materials. While in this exemplary embodiment, ASG material is provided over OLED materials 3004, ASG material may be provided at any one or more steps or stages in the OLED deposition processes to protect materials and also to separate or segregate materials for various colors that would be interconnected with electrical vias through the material.

Figure 34:
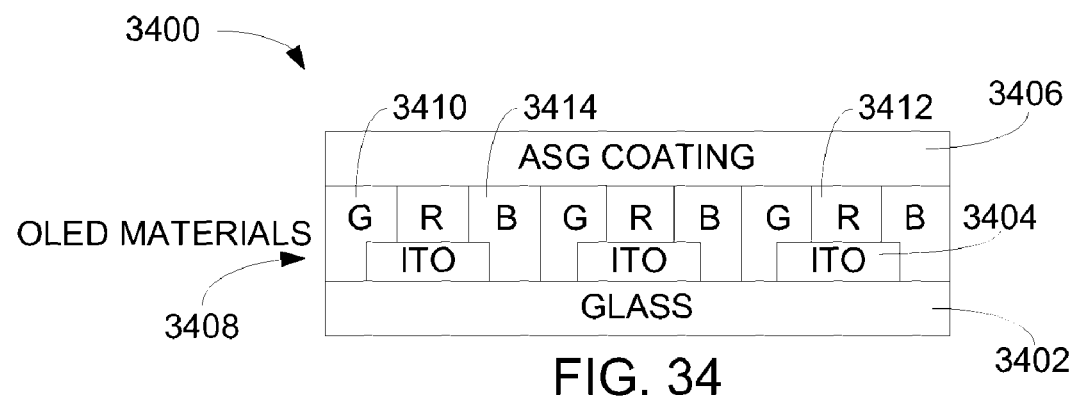
FIG. 34 is a schematic cross-sectional diagram of a display assembly, according to another exemplary embodiment.

Turning to FIG. 34, a display assembly is shown according to an alternative embodiment. In this embodiment, display assembly 3400 comprises a glass substrate 3402, ITO elements 3404, and an ASG coating 3406 provided in a configuration similar to that described with reference to FIGS. 29-33. In this embodiment, OLED materials 3408 comprise OLED materials of different colors, such as a first color OLED material 3410, a second color OLED material 3412, and a third color OLED material 3414. ASG coating 3406 may be configured to seal or protect OLED materials 3408 from ambient air.

Figure 35:
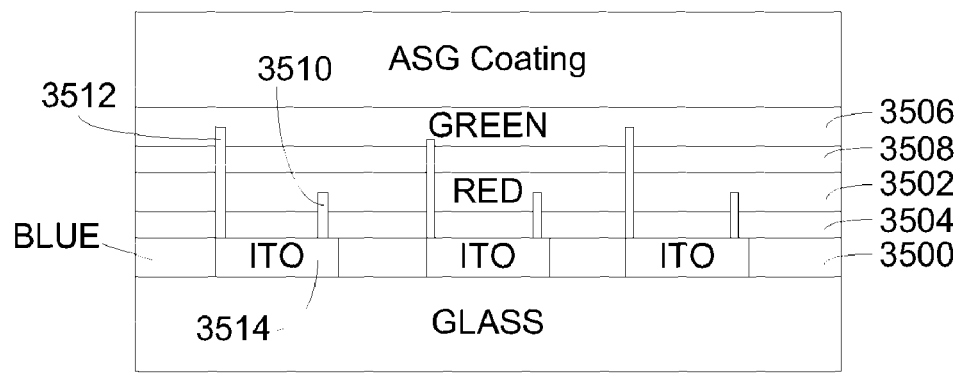
FIG. 35 is a schematic cross-sectional diagram of a display assembly, according to another exemplary embodiment.

Referring now to FIG. 35, in this embodiment, a first color OLED material 3500 is separated from a second color OLED material 3502 by an alkali silicate glass material 3504. Similarly, the second color OLED material 3502 is separated from a third color OLED material 3506 by ASG layer 3508. Further, ITO elements are disposed in contact with OLED material of a first color 3500 and also provide electrical interconnects to the OLED material of the second color 3502 (3510). Interconnects 3512 provide electrical connectivity between ITO elements 3514 and OLED material of a third color 3506. In this embodiment, ASG material may be used as a dielectric or diffusion layer between layers of differently colored OLED materials. In this embodiment, the ASG material may at least partially separate one OLED material of a first color from an OLED material of a second color different from the first color.

Referring now to FIGS. 36-39, a method and display assembly according to another embodiment will be described. In this embodiment, ASG material is used in a process of sealing a space within an LCD stack-up, though the steps shown herein may be applied to alternative display technologies In some cases of the assembly of an LCD system, tolerance constraints require that spaces are left between components of the LCD system. These spaces may then be sealed. According to one approach, an organic sealant is used. ASG may be applied in place of or prior to the application of the organic sealant. ASG material may provide better moisture protection than the organic materials and/or could be used to improve adhesion of the sealant, if sealant is used.

Figure 36:
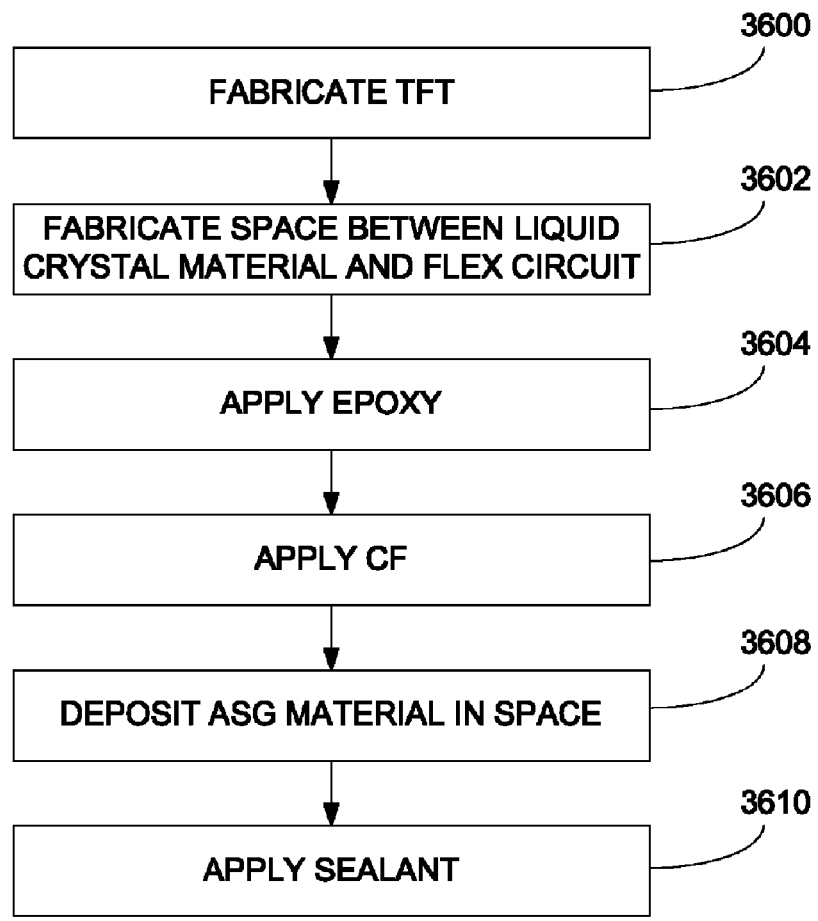
FIG. 36 is a flow diagram of a method of making a display assembly, according to an exemplary embodiment.
Figure 37:
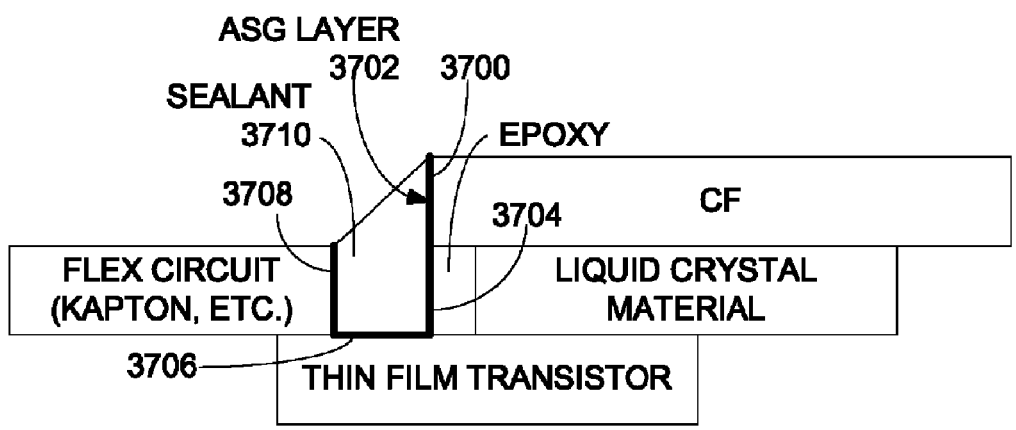
FIGS. 37-39 are schematic cross-sectional diagrams of a display assembly, illustrating steps according to the flow diagram of FIG. 36.
Figure 38:
Figure 39:
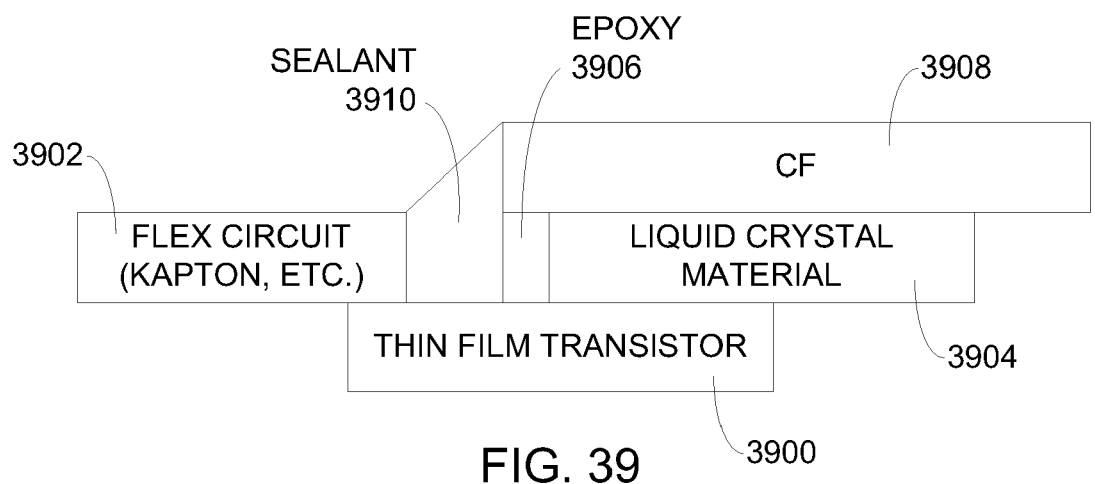
Figure 40:
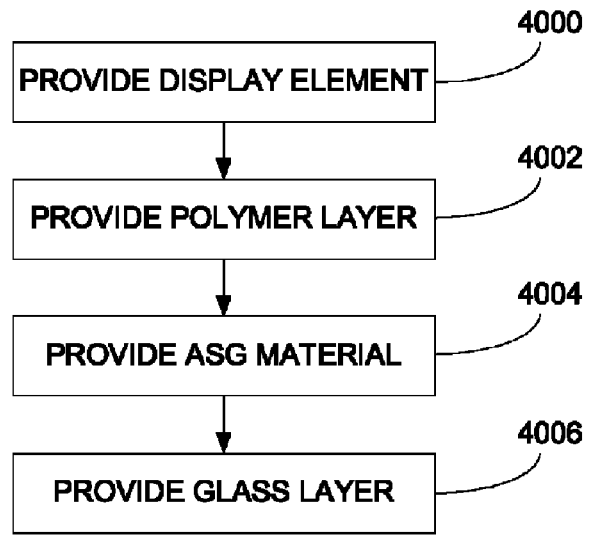
FIG. 40 is a flow diagram of a method of making a display assembly, accordingly to an exemplary embodiment.

Referring to FIG. 36, at a step 3600, a thin film transistor or other electronic display component 3800 (FIG. 38) is fabricated, for example, on the substrate. For example, the electronic display component 3800 may comprise an Indium Tin Oxide element or circuit. At a step 3602, a flex circuit 3902, made of a material such as Kapton or another thin organic substrate, is fabricated in electrical contact with the thin film transistor 3900. A liquid crystal material 3904 is also applied and held in place with an epoxy 3906. Further, a color filter (CF) substrate is applied 3908. Returning to FIG. 39, a space 3910 may be fabricated between epoxy 3906 and flex circuit 3902, as a natural consequence of the assembly process and is most typically a design attribute to account for assembly tolerances. At step 3608, an ASG material 3700 is provided as shown in FIG. 37, in this exemplary embodiment as a thin film coating edges 3702, 3704, 3706 and 3708 of component CF, epoxy, thin film transistor, and the flex circuit, respectively. Sealant 3710 is then applied at a step 3610 within the ASG layer 3700. According to one alternative embodiment, ASG material may be used without sealant 3710 by providing the ASG material to fill or substantially fill the space or aperture.

Figure 41:
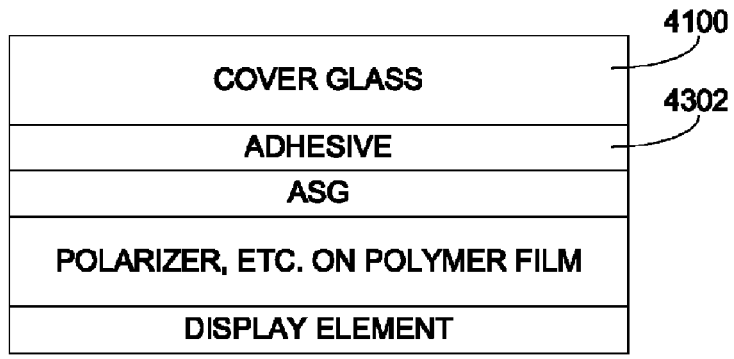
FIGS. 41-43 are schematic cross-sectional diagrams of a display assembly, illustrating the steps according to the flow diagram of FIG. 40.
Figure 42:

Referring now to FIGS. 40-43, exemplary methods and display assemblies according to alternative embodiments will be described. At a step 4000, a display element is provided. At a step 4002, a polymer layer is provided. At a step 4004, an ASG material is provided over the polymer material. At a step 4006, a cover glass layer is provided over the ASG material. In this embodiment, the ASG material may be provided between the glass material and the polymer material, wherein the display element provides a display illumination through the glass layer or material. In this embodiment, the ASG material may improve adhesion between the adhesive layer and the polymer layer. The ASG material will adhere to the polymer layer surface better than the adhesive layer will adhere to the polymer layer directly. As shown in FIG. 42, a display element 4200, which may comprise an LCD material in this exemplary embodiment, is overlaid by a polymer film layer 4202. In this embodiment, the film is laminated to the display element.

Figure 43:
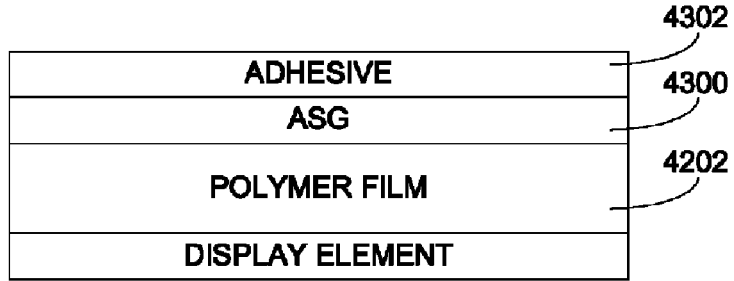

Referring to FIG. 43, glass to glass adhesive may be applied using one or more of the following steps or processes: a dry film adhesive can be roll laminated or attached using the drop method under a vacuum, a liquid can be poured, dispensed, sprayed, etc. An ASG coating 4300 is provided over the glass to glass adhesive 4202. Referring to FIG. 41, The cover glass 4100 is then laminated to the other side of the adhesive 4302.

Many adhesives are suitable for either polymer bonding or glass bonding. In applications where glasses need to be bonded to polymers, such as in certain display technologies, the adhesion strength to one of these interfaces will be compromised. Polymer films may comprise Cyclo-Olefins, polycarbonate, cellulose triacetate, etc., and such films may be used in displays as polarizers, optical filters, privacy screens, etc and typically have very low surface energy. Applying an ASG material, such as a thin layer of ASG to the polymer film (between about 50 and 200 nanometers thick, more than about 50 nanometers thick, between 200 nanometers and 1 micron, etc. prior to adhesive bonding can provide glass to glass (ASG) bonding, thus allowing for better bonding between polymer film and the adhesive and allow for significantly more adhesive candidates to be considered.

According to one alternative embodiment, a filter for display may comprise a polymer film and an alkali silicate glass layer covering at least a portion of the polymer film. Mechanical, optical, or other properties of a surface may be modified by applying an alkali silicate glass layer to the surface or coating to achieve better performance, higher reliability, and/or lower cost as compared to conventional methods.

Figure 44:
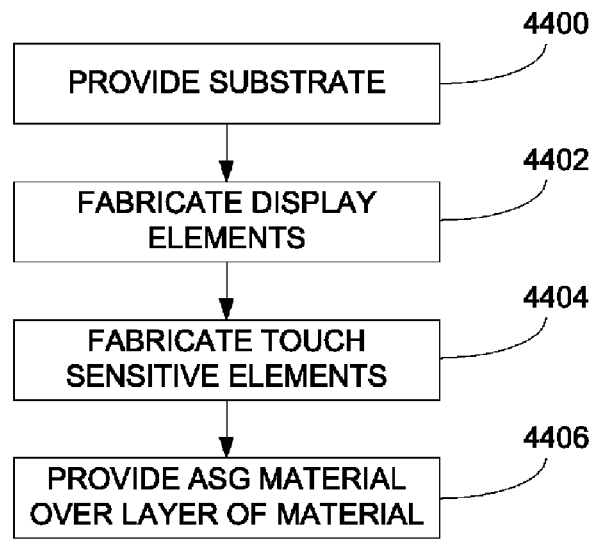
FIG. 44 is a flow diagram of a method of making a display assembly, according to an exemplary embodiment.
Figure 45:
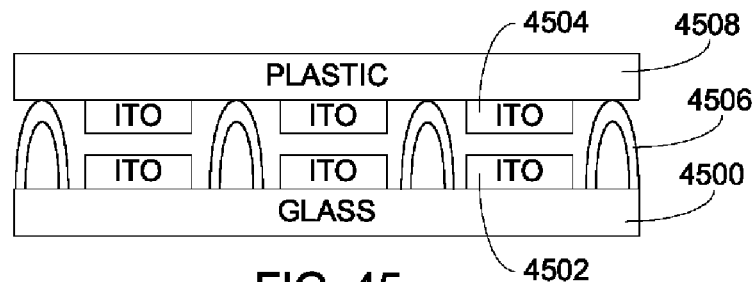
FIGS. 45-46 are schematic cross-sectional diagrams illustrating a touch screen feature, according to an exemplary embodiment.
Figure 46:
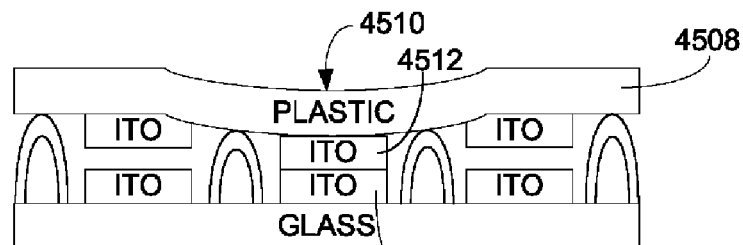
Figure 47:
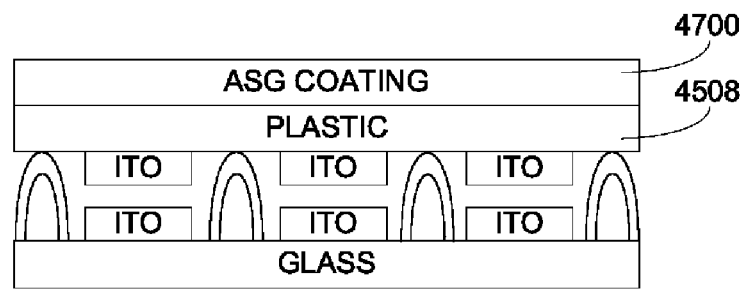
FIG. 47 is a schematic cross-sectional diagram of an ASG material on the touch screen portion of the display assembly of FIGS. 45 and 46.

Referring to FIGS. 44-45, an exemplary method and assembly will be described. At a step 4400, a substrate is provided, such as a glass substrate 4500. At a step 4402, display elements are fabricated, such as ITO conductors 4502 or other display elements. At a step 4404, touch sensitive elements, which may comprise one or more of the same or different elements than the display elements, may be fabricated. In the embodiment of FIG. 45, touch sensitive elements comprise ITO conductors 4502 and 4504 as well as mechanical spacers 4506. These spacers are typically compressible beads of polymer such as polystyrene or by dots of compliant adhesive. These are configured to provide a space or distance between a layer of material 4508 and substrate 4500. At a step 4406, layer of material 4508 is formed over the touch sensitive elements, which layer may be a flexible, durable, non-flexible, or other insulative, conductive, or other layer of material configured to receive a touch from a user's finger or device held by a user. As shown in FIG. 46, in response to a force or pressure from a user or object, in this embodiment, material 4508 distort at deflection point 4510 to form an electrical connection between ITO 4512 and ITO 4514. As shown in FIG. 47, at a step 4408, an ASG material 4700 may be provided over layer 4508 for any number of purposes. For example, the ASG material may be applied to a plastic layer 4508 to improve durability and/or scratch resistance. The thickness of the layer of ASG material may also be selected based on a desire to adjust, increase, or decrease a deflection force required for contact of the touch-sensitive elements 4512 and 4514. For example, a thickness of 50 nanometers to 5 microns will likely provide the desired durability and hardness; larger thicknesses of 5 to 100 microns may be needed to sufficiently affect stiffness. According to another exemplary embodiment, commonly available hydrophobic and/or anti-smudge materials may be added to the ASG coating prior to application and cured or provided over the ASG coating after it has cured. The hydrophobic and/or antismudge material may be applied over a touch screen (e.g., resistive, capacitive, etc.) or other display screen.

Figure 48:
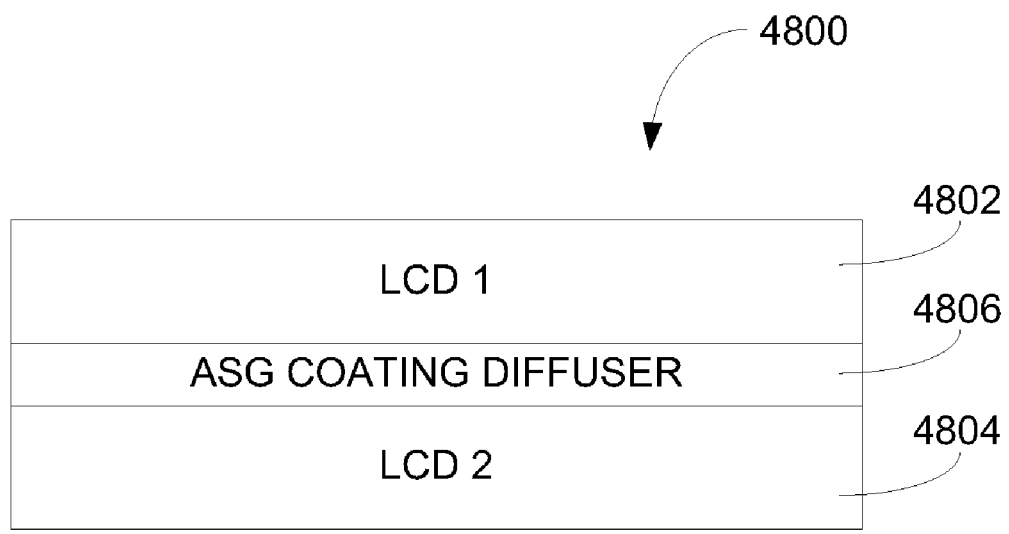
FIG. 48 is a schematic cross-sectional diagram of a stacked LCD assembly, according to an exemplary embodiment.
Figure 49:
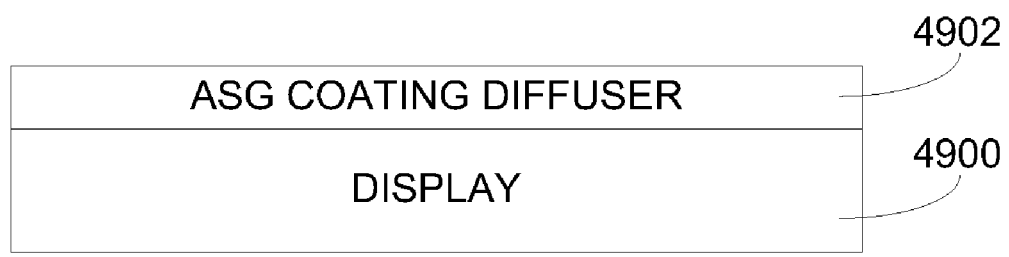
FIG. 49 is a schematic cross-sectional diagram of an ASG diffusion coating on a display, according to an exemplary embodiment.

Referring now to FIG. 48, an alternative embodiment of a display assembly 4800 arranged in a stacked display configuration is shown. A first LCD layer 4802 and a second LCD layer 4804 are separated in this embodiment by an ASG layer 4806. ASG layer 4806 may be configured to diffuse light optically, such as by providing a roughened surface to create an optical diffuser. In one application, the optical diffuser may be configured to prevent or reduce Moiré interference effects from the perspective of a viewer of LCD layers 4802 and 4804. FIG. 49 shows an alternative embodiment of a single display layer 4900 with an ASG coating 4902 covering display 4900. ASG coating 4902 may be configured as a light diffuser and may be placed on either a front or a back surface (or both) of display layer 4900.

In any of the embodiments described herein, the ASG material may be combined with a particle filler, such as a nano-particle filler, such as magnesium fluoride in order to alter the refractive index and create an anti-reflective coating. In alternative embodiments, scratch resistant coatings on polymers or glasses used in displays may be formed by providing particle fillers, such as nano-particle fillers, such as high volume loading of hard particle fillers within the alkali silicate glass material. The particles may comprise diamond, SiN, Alumina, etc. and may be applied with a thickness of less than 50 nanometers, between 50 and 200 nanometers or less than about 200 nanometers to allow optical transparency, yet to provide scratch resistance. When applied to polymers, the alkali silicate glass with the nano-particles will provide a significant hardness improvement, which may provide a hardness improvement of an order of magnitude or better than the polymer alone.

According to other embodiments, ASG materials can be used for anti-reflective coatings in displays. The ASG material can be applied to achieve any of a number of types of anti-reflective coatings, such as a single-layer interference coating, a multi-layer coating (e.g. a multi-coating), an interference coating, an absorbing AR coating, Moth Eye, which is an anti-reflective method which uses physical structures smaller than the wavelength of visible light.

According to one embodiment, a capacitive touch screen may use a sol gel, which is a material that typically includes a glass forming component, such as colloidal silica, in an organic carrier and generally requires high processing temperatures, for sealing ITO electrical circuits against moisture. In these touch screens, the sol gels may be replaced in whole or in part with ASG to reduce cost and improve robustness. According to some embodiments, a barrier coating for sensitive optical films may be provided by using the ASG material while also providing a "glass like" bonding surface. The ASG material may be applied by spin coating, dipping, etc. and subsequently cured, even at low temperatures. The ASG material can provide a more robust surface that can be handled, cleaned, and provide a more balanced mechanical configuration for thermal co-efficient of expansion differences. In addition, overall process cycle time may be reduced due to the surface treatments and bake-out requirements typically imposed upon plastic surfaces. Furthermore, some of the ASG coatings may contain nano-particles for specific purposes. Since LCD performance is sensitive to thermal uniformity, the ASG barrier could be utilized for thermal management as well.

While exemplary embodiments have been shown with respect to displays such as LCDs and OLEDs, other flexible displays may use the teachings described herein. The ASG material may be used as an external barrier to keep moisture out of such displays. In some embodiments, the ASG material may be configured to substantially or completely seal off a polymer film or polymer material from ambient air.

In alternative embodiments, the alkali silicate glass material may be provided as a coating over any materials which are porous in use in a display or outside of displays.

According to one exemplary process, a display element or material, such as an OLED material, may be processed or fabricated on a web in a roll-to-roll system.

According to some embodiments, the ASG material may be applied over a metalized surface to prevent corrosion. The ASG material may provide active components within the display assembly, such as a matrix of display elements, transistors, etc.

In some embodiments, the display may have multiple laminated layers and an ASG coating between each of a plurality of sets of layers. In other embodiments, the ASG material may be sprayed on the outside or top surface of a display as a final layer.

As described above, optical filtering can be done with the ASG material, such as filtering light for certain wavelengths of light, night vision, infrared, etc.

In one embodiment, the ASG material may be configured to diffuse light for a backlighting application, such as an application in which a plurality of discrete light sources, such as LEDs, provide light through the ASG material which diffuses the light to provide a substantial uniform output of illumination over the surface area of the ASG material.

According to another embodiment, the ASG material may be loaded or provided with phosphor elements, and the phosphor elements may be excited with one frequency of light to produce a different frequency or color of light. In one application, an ASG material with phosphors can minimize damage to solar cell panels from light in the ultra violet wavelength, since light in the ultraviolet wavelength may degrade solar cell panels over time.

The touch screen technologies described herein may be resistive touch screens, capacitive touch screens, single or multi touch screens, infrared or other light detection technologies, such as surface acoustic wave technology using ultrasonic waves that pass over a touch screen panel, projected capacitance touch technology, infrared optical touch screen technology, strain gauge technology, optical imaging in which two or more image sensors are placed around the edges of a screen to detect the presence of a finger or object, etc.

According to one exemplary embodiment, an ASG material is applied to seal off or substantially seal off a polymer film or material (or other porous film or material) in a display assembly from sources of moisture, oxygen, or other materials, such as ambient air or other display components. In one exemplary embodiment, the display material may be processed in a flexible state (e.g., a roll-to-roll, web processing) and subsequently mounted in a substantially non-flexible manner for use. The ASG material may be applied at any stage in this process.

In various embodiments, ASG material may be applied between multiple layers of a display. The ASG material may be deposited on a sheet, by spraying, wiping, spinning, etc. and then laminated to embed the material within the display layers. In an alternative embodiment, ASG material may be sprayed on a top layer of a display as a final step in a process or on internal layers within the assembly.

According to one embodiment, ASG material may be applied on a flexible display substrate with a sufficiently thin layer of ASG material to allow at least some flexing of the ASG material along with flexing of the display substrate. For example, a thickness of less than 10 microns would be suitable.

According to another exemplary embodiment, a flexible substrate is provided, such as an organic substrate having a glass barrier on it. OLED materials may then be deposited on the flexible substrate. Then ASG material may be provided on top of the OLED materials to seal from a back side of the display (i.e., a side opposite the side to be viewed by a viewer).

Various features of alkali silicate glass materials in the context of coatings for integrated circuit and electronics packages are described in co-pending U.S. patent application Ser. No. 11/508,782, filed Aug. 23, 2006 and co-pending U.S. patent application Ser. No. 11/959,225, filed Dec. 18, 2007, the entire disclosures of which are incorporated herein by reference.

According to various exemplary embodiments, the coating may be a coating described in U.S. patent application Ser. No. 11/508,782, filed on Aug. 23, 2006, and entitled "Integrated Circuit Protection and Ruggedization Coatings and Methods," U.S. patent application Ser. No. 11/784,158, filed on Apr. 5, 2007 and entitled "Hermetic Seal and Hermetic Connector Reinforcement and Repair with Low temperature Glass Coatings," U.S. patent application Ser. No. 11/732,982, filed on Apr. 5, 2007, and entitled "A Method for Providing Near-Hermetically Coated Integrated Circuit Assemblies," U.S. patent application Ser. No. 11/732,981, filed on Apr. 5, 2007, and entitled "A Method for Providing Near-Hermetically Coated, Thermally Protected Integrated Circuit Assemblies," U.S. patent application Ser. No. 11/784,932, filed on Apr. 10, 2007, and entitled "Integrated Circuit Tampering Protection and Reverse Engineering Prevention Coatings and Methods," U.S. patent application Ser. No. 11/959,225, filed on Dec. 18, 2007, and entitled "Adhesive Applications Using Alkali Silicate Glass for Electronics," U.S. patent application Ser. No. 11/959,225, filed Dec. 18, 2007, and entitled "Adhesive Applications for Using Alkali Silicate Glass for Electronics," and U.S. application Ser. No. 12/116,126, filed on May 6, 2008, and entitled "System and Method for a Substrate with Internal Pumped Liquid metal for thermal Spreading and Cooling," each of which is herein incorporated by reference in its entirety.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims. References to "a" or "an" in the claim are intended to be open-ended and to cover "one or more" or "a plurality" of elements.

It should be noted that references to relative positions (e.g., "top" and "bottom") in this description are merely used to identify various elements as are oriented in the FIGURES. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the construction and arrangement of the components as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may be made in the design, operating conditions and arrangement of the various exemplary embodiments without departing from the scope of the present inventions as expressed in the appended claims.

What is claimed is:

1. A display assembly, comprising:
   an electronic display element;
   a layer of material;
   an alkali silicate glass material at least partially covering at least one of the electronic display element and the layer of material; and
   a touch screen,
   the layer of material being a deflectable material, and the alkali silicate glass coating overlaying the layer of deflectable material and configured to be touched by a user.

2. The display assembly of claim 1, wherein the electronic display element is a flexible display substrate.

3. The display assembly of claim 1, wherein the alkali silicate glass material is configured to protect at least one of the electronic display element and the layer of material from at least one of moisture and oxygen.

4. The display assembly of claim 1, wherein the layer of material has an edge and the electronic display element has an edge, wherein the alkali silicate glass material is configured to at least partially seal the edges of the layer of material and the electronic display element.

5. The display assembly of claim 1, further comprising touch sensitive elements, wherein the alkali silicate glass material is configured to at least partially seal the touch sensitive elements.

6. The display assembly of claim 1, wherein the layer of material comprises a polymer material and the alkali silicate glass material at least partially covers the polymer material.

7. The display assembly of claim 1, wherein the electronic display element comprises an organic light emitting display material.

8. The display assembly of claim 1, wherein the layer of material is a flexible substrate and the alkali silicate glass material at least partially covers the flexible material.

9. The display assembly of Claim 7, wherein the organic light emitting display material has a first color, further comprising a second organic light emitting display material of a second color different than the first color, wherein the alkali silicate glass material at least partially separates the organic light emitting display material of the first color from the second organic light emitting display material of the second color.

10. The display assembly of claim 1, further comprising a circuit element coupled to the electronic display element and defining a space between the circuit element and electronic display element, wherein the alkali silicate glass material is disposed in the space.

11. The display assembly of claim 10, further comprising an organic sealant disposed in the space, wherein the alkali silicate glass material is configured to provide adhesion of the organic sealant to at least one of the circuit element and the electronic display element.

12. The display assembly of claim 1, wherein the alkali silicate glass material is configured to optically diffuse light transmitted through the alkali silicate glass material.

13. The display assembly of claim 12, wherein the electronic display element comprises a liquid crystal display layer, further comprising a second liquid crystal display layer, wherein the alkali silicate glass material is disposed between the liquid crystal display layer and the second liquid crystal display.

14. The display assembly of claim 1, wherein the alkali silicate glass material comprises particles configured to alter the refractive index of the alkali silicate glass material.

15. The display assembly of claim 14, wherein the alkali silicate glass material is an anti-reflective coating on a top layer of the display assembly.

16. The display assembly of claim 1, wherein the alkali silicate glass material comprises hard particle fillers, further comprising a polymer layer, wherein the alkali silicate glass material at least partially covers the polymer layer and thereby increases the scratch resistance of the polymer layer.

17. A display assembly, comprising:
a display element;
a glass material;
a polymer material; and
an alkali silicate glass material between the glass material and the polymer material, wherein the display element provides illumination through the glass material.

18. The display assembly of claim 17, wherein the alkali silicate glass material has a thickness of between about 50 nanometers and about 200 nanometers.

19. The display assembly of claim 17, wherein the alkali silicate glass material is adhesively bonded to either or both the polymer material or to the glass material, thereby providing a suitable bonding interface between the polymer and glass materials.

20. The display assembly of claim 17, wherein the glass material is a non-alkali silicate glass material.

* * * * *